(12) United States Patent
Yang et al.

(10) Patent No.: US 11,557,508 B2
(45) Date of Patent: Jan. 17, 2023

(54) SEMICONDUCTOR DEVICE STRUCTURE HAVING PROTECTION CAPS ON CONDUCTIVE LINES

(71) Applicant: Taiwan Semiconductor Manufacturing Co., Ltd., Hsinchu (TW)

(72) Inventors: Ting-Li Yang, Tainan (TW); Wei-Li Huang, Pingtung (TW); Sheng-Pin Yang, Kaohsiung (TW); Chi-Cheng Chen, Tainan (TW); Hon-Lin Huang, Hsinchu (TW); Chin-Yu Ku, Hsinchu (TW); Chen-Shien Chen, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/994,091

(22) Filed: Aug. 14, 2020

(65) Prior Publication Data

US 2020/0381293 A1 Dec. 3, 2020

Related U.S. Application Data

(62) Division of application No. 15/991,523, filed on May 29, 2018, now Pat. No. 10,748,810.

(51) Int. Cl.
*H01L 23/00* (2006.01)
*H01L 23/04* (2006.01)
(Continued)

(52) U.S. Cl.
CPC ... *H01L 21/76816* (2013.01); *H01F 17/0013* (2013.01); *H01F 17/0033* (2013.01);
(Continued)

(58) Field of Classification Search
CPC ............... H01L 28/10; H01L 21/76802; H01L 21/76804; H01L 21/76816; H01L 21/7685;
(Continued)

(56) References Cited

U.S. PATENT DOCUMENTS 8,432,017 B2 4/2013 Kuo et al.
2003/0070282 A1 4/2003 Hiatt et al.
(Continued)

*Primary Examiner* — Younes Boulghassoul
(74) *Attorney, Agent, or Firm* — Birch, Stewart, Kolasch & Birch, LLP

(57) ABSTRACT

A semiconductor device structure is provided. The semiconductor device structure includes a first conductive line over a substrate. The semiconductor device structure includes a first protection cap over the first conductive line. The semiconductor device structure includes a first photosensitive dielectric layer over the substrate, the first conductive line, and the first protection cap. The semiconductor device structure includes a conductive via structure passing through the first photosensitive dielectric layer and connected to the first protection cap. The semiconductor device structure includes a second conductive line over the conductive via structure and the first photosensitive dielectric layer. The semiconductor device structure includes a second protection cap over the second conductive line. The semiconductor device structure includes a second photosensitive dielectric layer over the first photosensitive dielectric layer, the second conductive line, and the second protection cap.

20 Claims, 18 Drawing Sheets

(51) Int. Cl.
  *H01L 23/522* (2006.01)
  *H01L 49/02* (2006.01)
  *H01F 41/04* (2006.01)
  *H01F 17/00* (2006.01)
  *H01L 23/532* (2006.01)
  *H01L 21/768* (2006.01)

(52) U.S. Cl.
  CPC ..... *H01F 41/046* (2013.01); *H01L 21/76877* (2013.01); *H01L 23/04* (2013.01); *H01L 23/5226* (2013.01); *H01L 23/53295* (2013.01); *H01L 24/11* (2013.01); *H01L 24/13* (2013.01); *H01L 24/16* (2013.01); *H01L 28/10* (2013.01); *H01F 2017/004* (2013.01); *H01L 2224/0401* (2013.01); *H01L 2924/163* (2013.01)

(58) Field of Classification Search
  CPC ......... H01L 21/76852; H01L 21/76865; H01L 21/76877; H01L 21/76879; H01L 23/5226; H01L 23/5227; H01F 17/0013; H01F 17/0033; H01F 2017/002; H01F 2017/004; H01F 2017/0066; H01F 2017/0086; H01F 27/2804; H01F 27/2828; H01F 2027/2809

See application file for complete search history.

(56) References Cited

U.S. PATENT DOCUMENTS

| | | |
|---|---|---|
| 2003/0141529 A1 | 7/2003 | Seto et al. |
| 2005/0099259 A1 | 5/2005 | Harris et al. |
| 2005/0181570 A1 | 8/2005 | Huang |
| 2008/0157910 A1 | 7/2008 | Park et al. |
| 2008/0198560 A1 | 8/2008 | Fujiwara et al. |
| 2008/0296769 A1* | 12/2008 | Hirota ............... H01L 21/76802 438/653 |
| 2009/0188104 A1 | 7/2009 | Ching et al. |
| 2013/0056847 A1* | 3/2013 | Chen ................... H01F 17/0013 257/E29.325 |
| 2015/0126005 A1* | 5/2015 | Kim ........................ G03F 7/022 430/286.1 |
| 2015/0187488 A1* | 7/2015 | Williams ............... H05K 3/061 29/606 |
| 2015/0340422 A1* | 11/2015 | Lee .......................... H01L 24/80 438/3 |
| 2015/0371764 A1 | 12/2015 | Gordin et al. |
| 2016/0013262 A1 | 1/2016 | England et al. |
| 2016/0079165 A1 | 3/2016 | Mei et al. |
| 2018/0261376 A1 | 9/2018 | Cheng et al. |
| 2018/0286940 A1 | 10/2018 | Peng et al. |
| 2019/0164681 A1 | 5/2019 | Kidwell, Jr. |

\* cited by examiner

SEMICONDUCTOR DEVICE STRUCTURE HAVING PROTECTION CAPS ON CONDUCTIVE LINES

CROSS REFERENCE

This application is a Divisional of U.S. application Ser. No. 15/991,523, filed on May 29, 2018, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes (e.g., diameters of conductive via structures) continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 to FIG. 1K-1 are cross-sectional views illustrating the semiconductor device structure along a sectional line I-I' in FIGS. 1A-1K, in accordance with some embodiments.

FIG. 1L-1 to FIG. 1P-1 are cross-sectional views illustrating the semiconductor device structure along a sectional line II-II' in FIGS. 1L-1P, in accordance with some embodiments.

FIG. 1P-2 is a cross-sectional view illustrating the semiconductor device structure along a sectional line I-I' in FIG. 1P, in accordance with some embodiments.

FIG. 2 is a top view of a semiconductor device structure, in accordance with some embodiments.

DETAILED DESCRIPTION

Figure 1A:
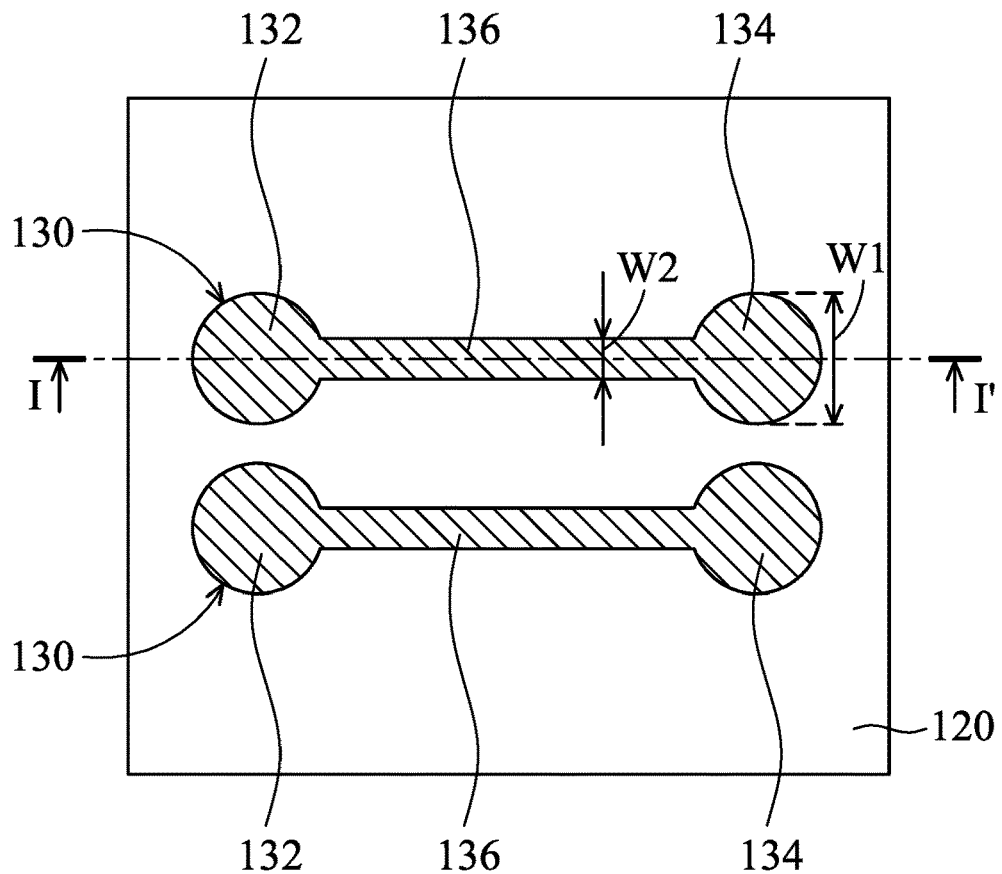
FIGS. 1A-1P are top views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figures 1, 1A:
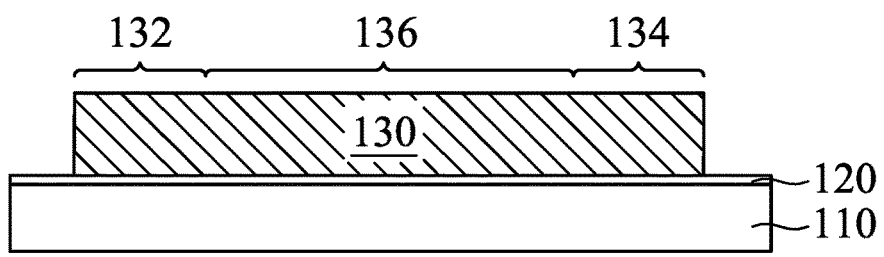
Figure 1B:
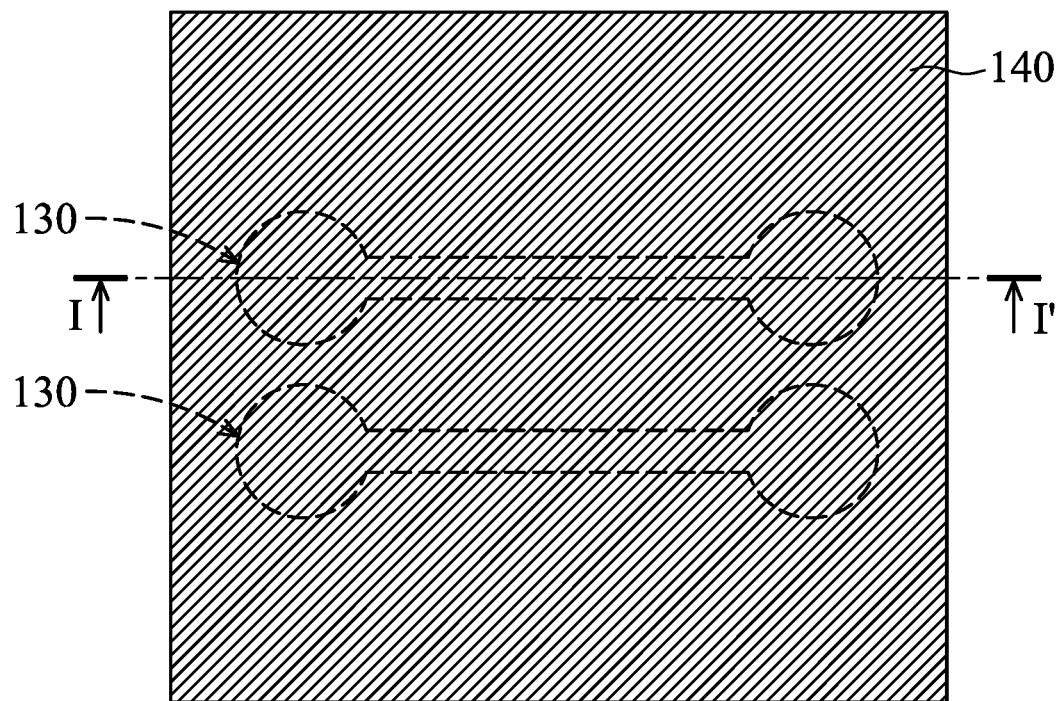
Figures 1, 1B:
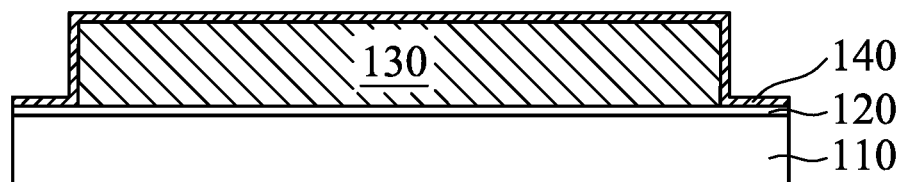
Figure 1C:
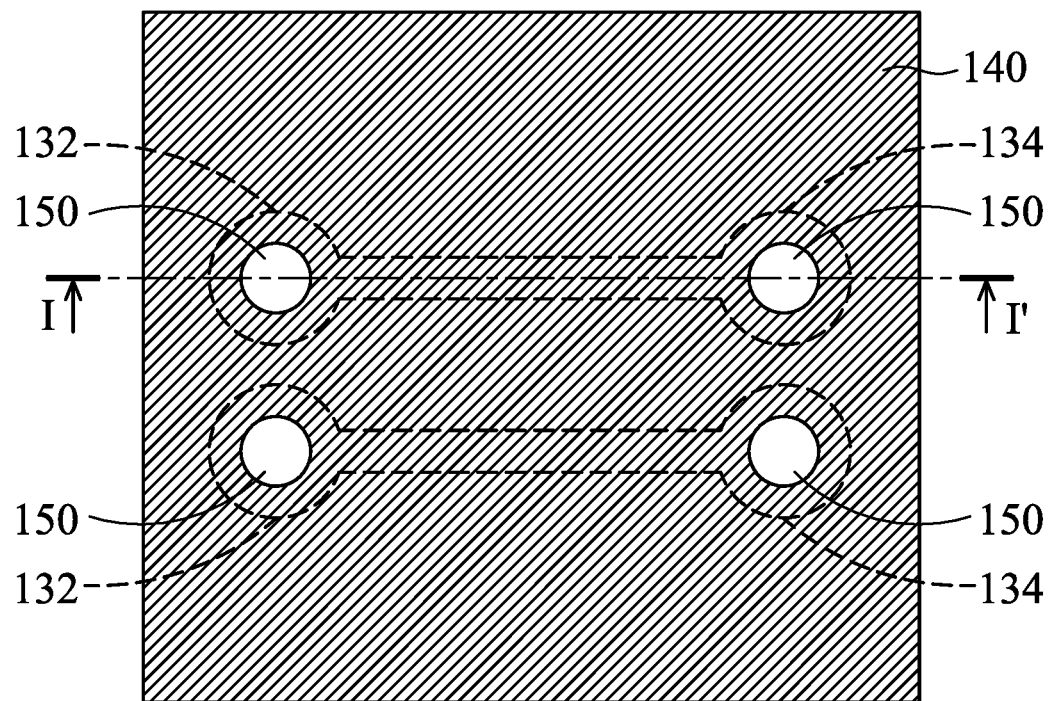
Figures 1, 1C:
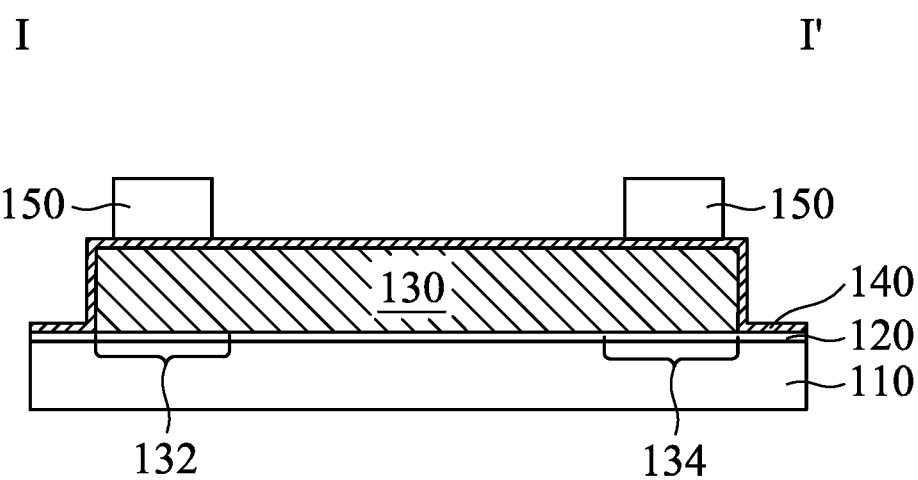
Figure 1D:
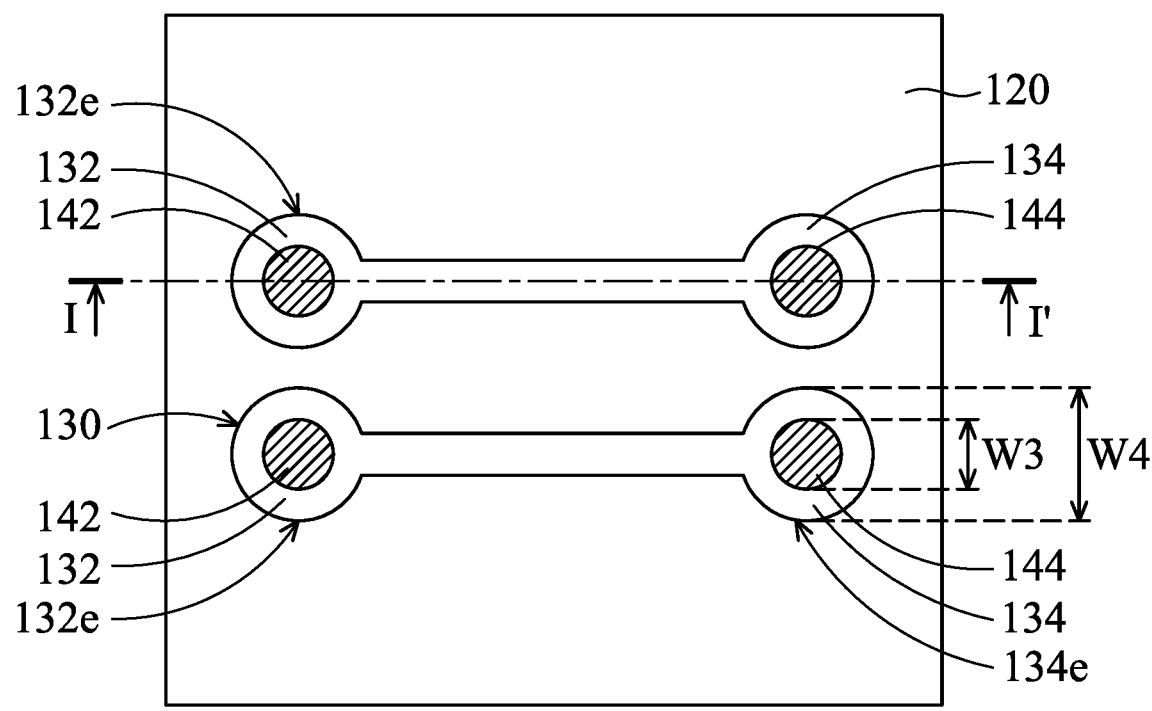
Figures 1, 1D:
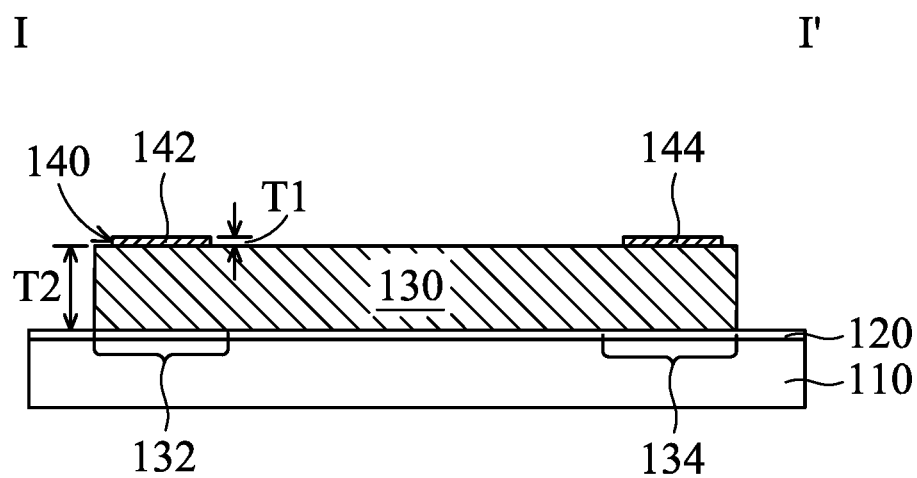
Figure 1E:
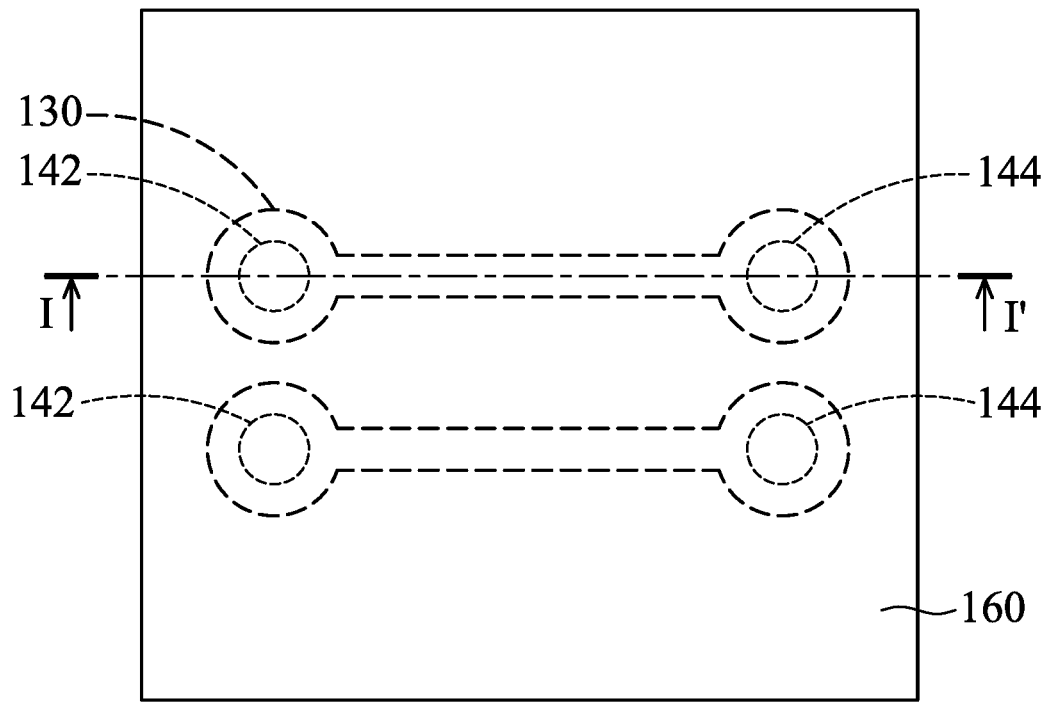
Figures 1, 1E:
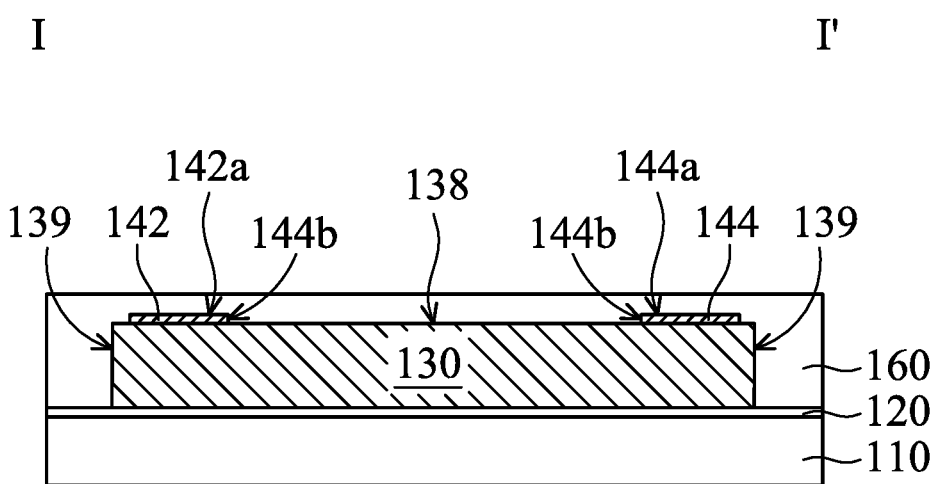
Figure 1F:
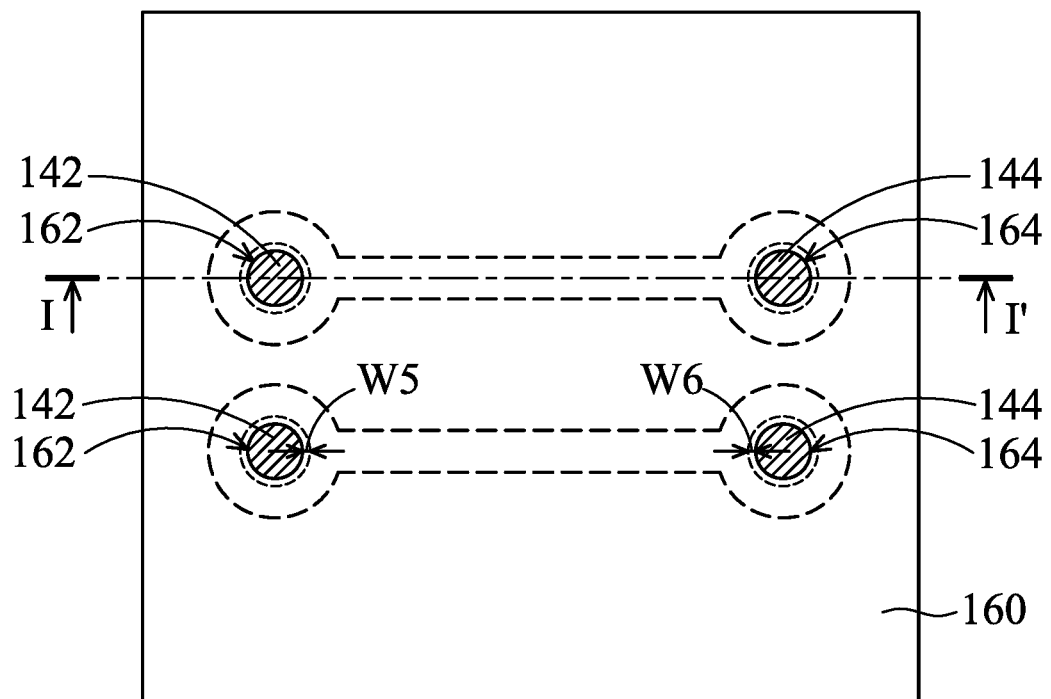
Figures 1, 1F:
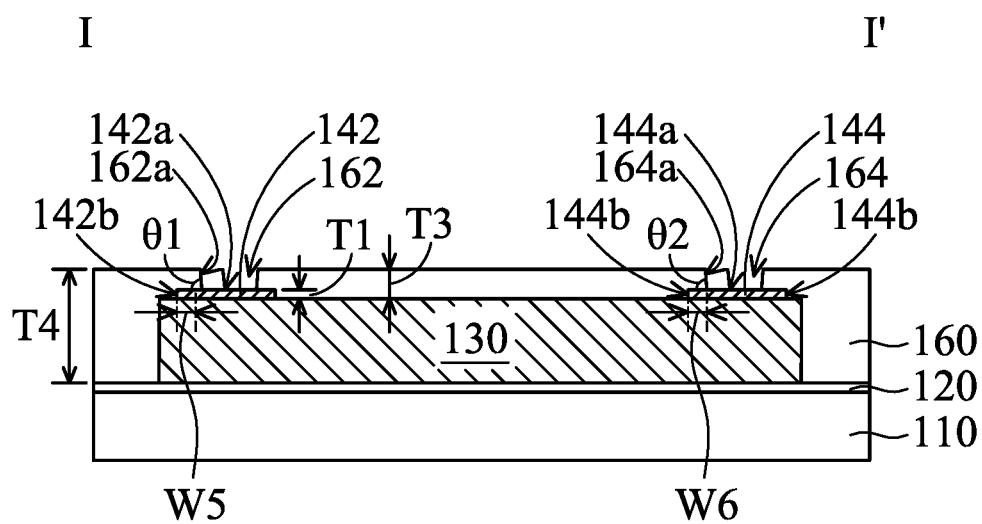
Figure 1G:
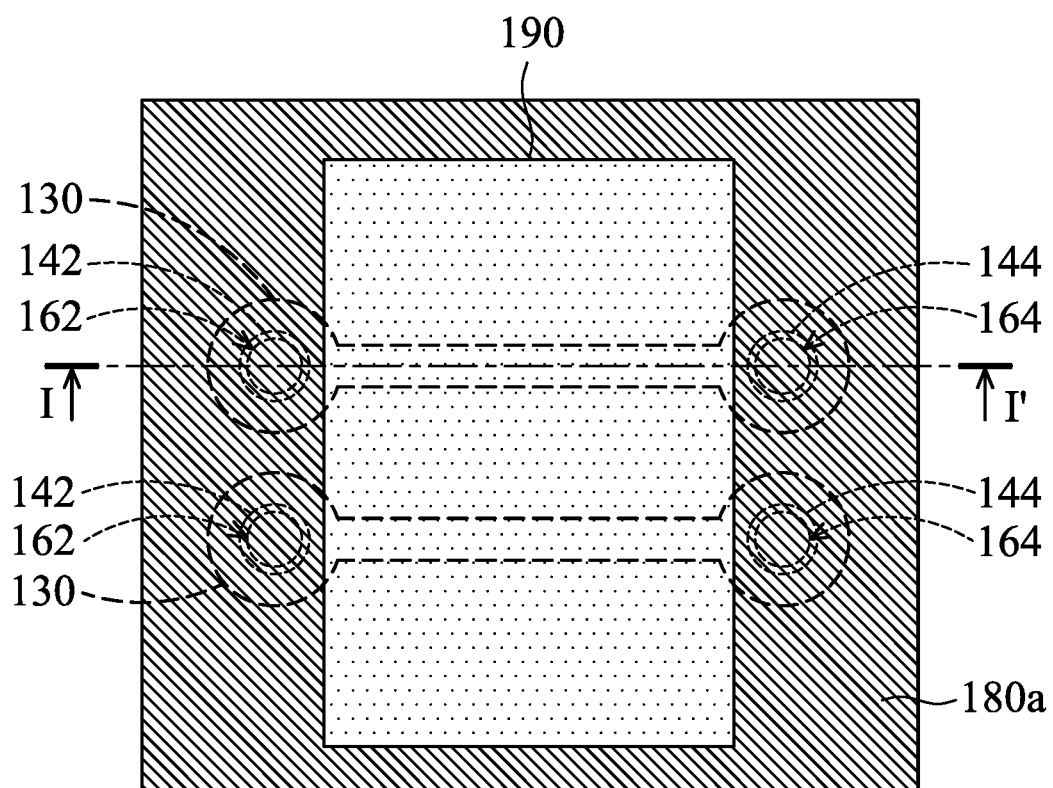
Figures 1, 1G:
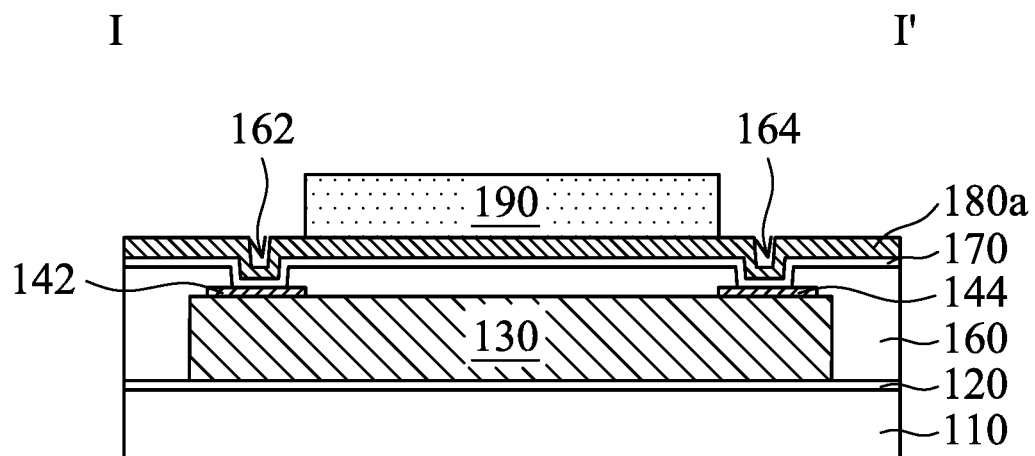
Figure 1H:
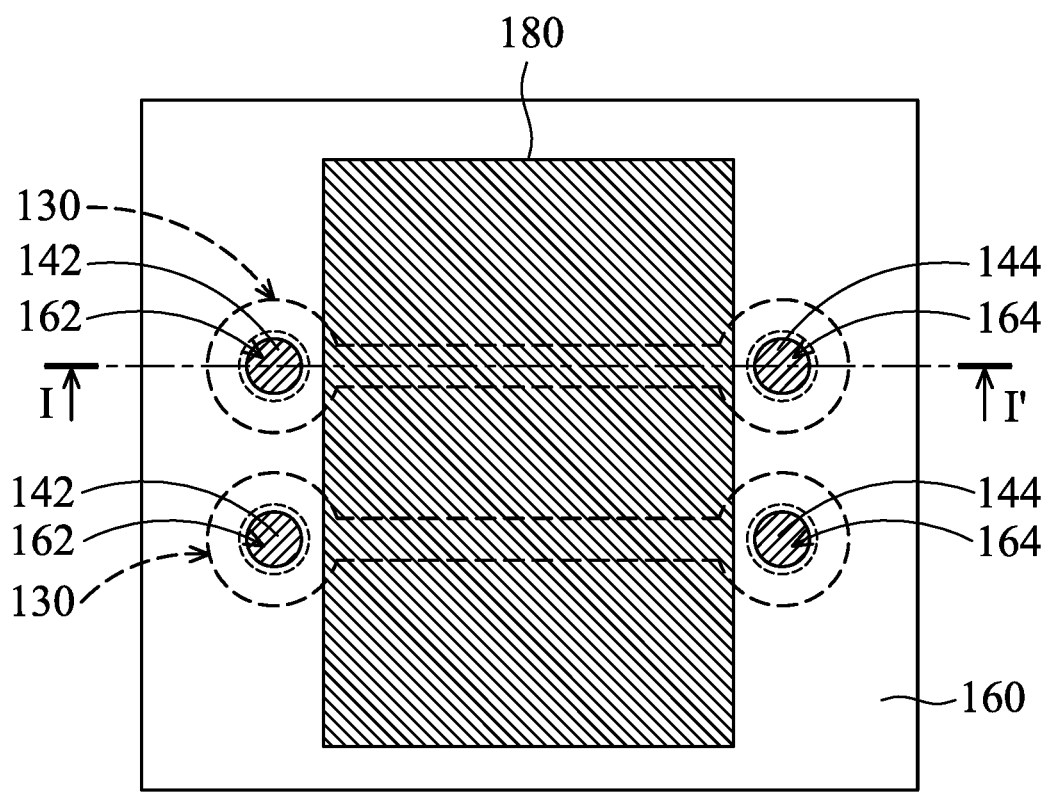
Figures 1, 1H:
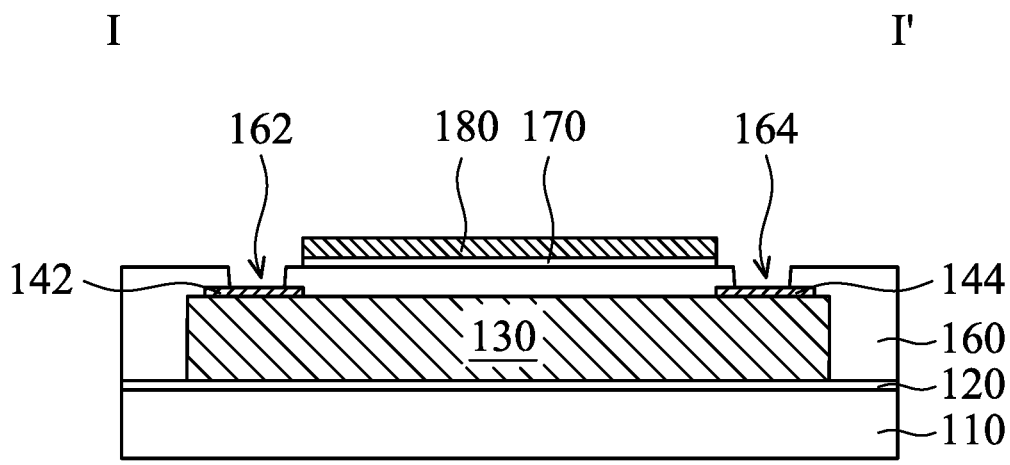
Figure 1I:
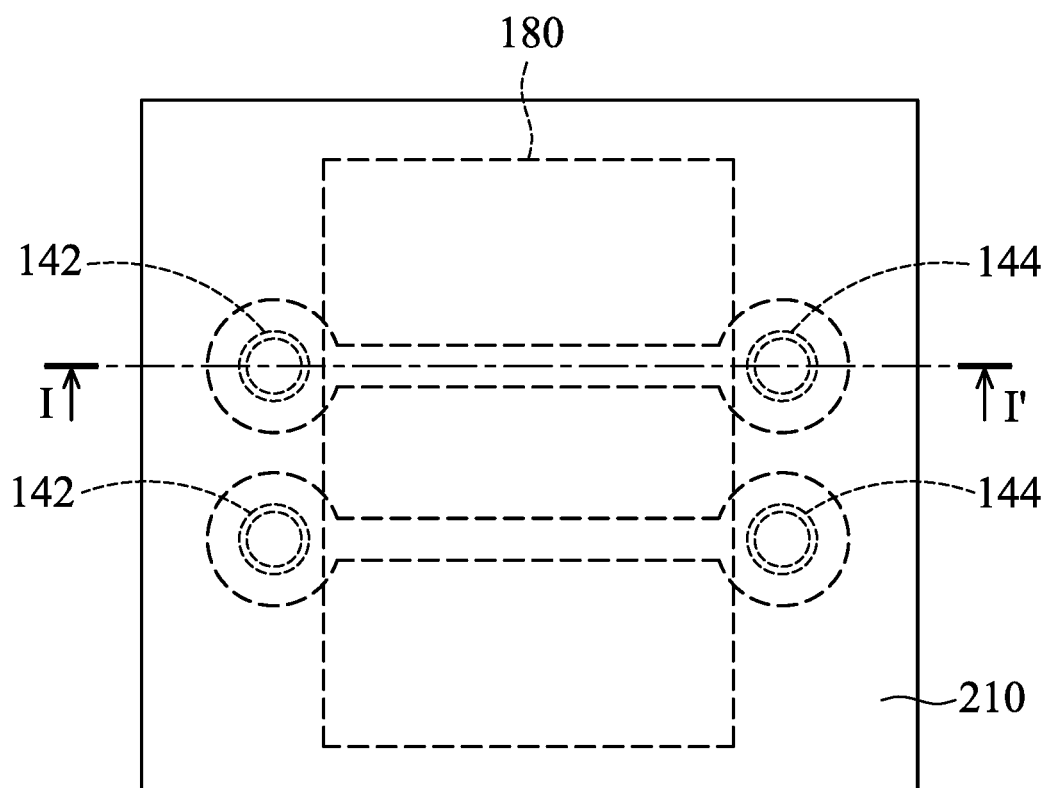
Figures 1, 1I:
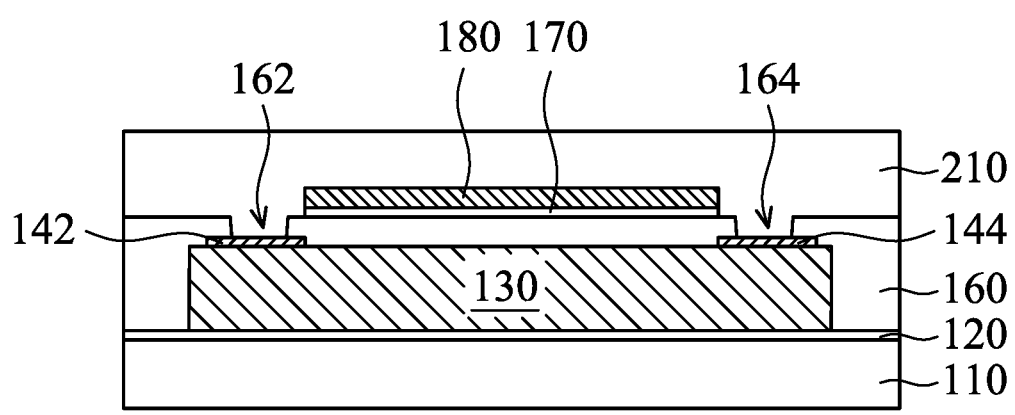
Figure 1J:
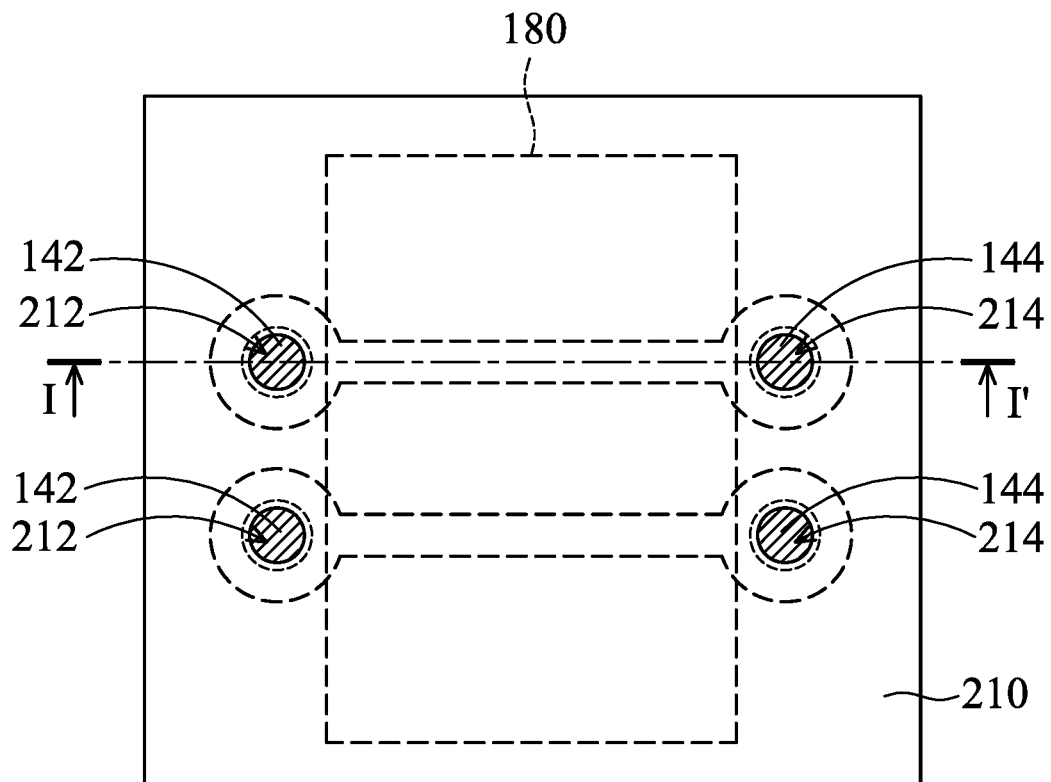
Figures 1, 1J:
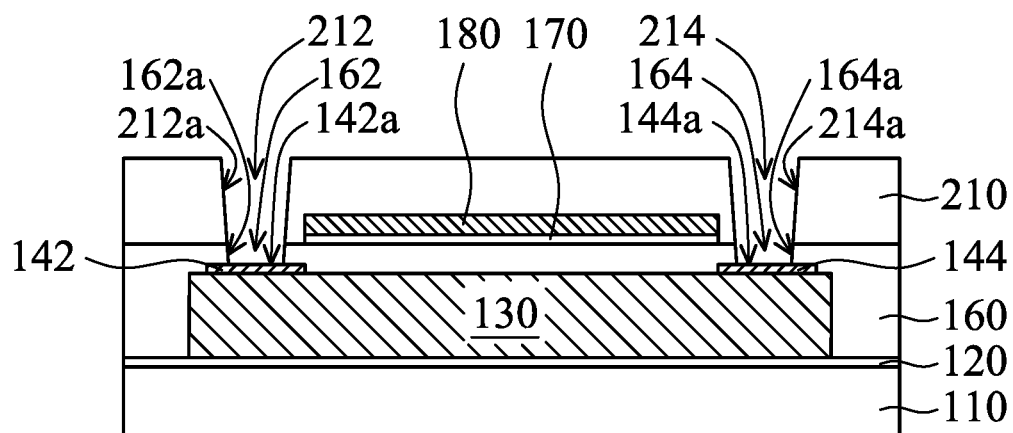
Figure 1K:
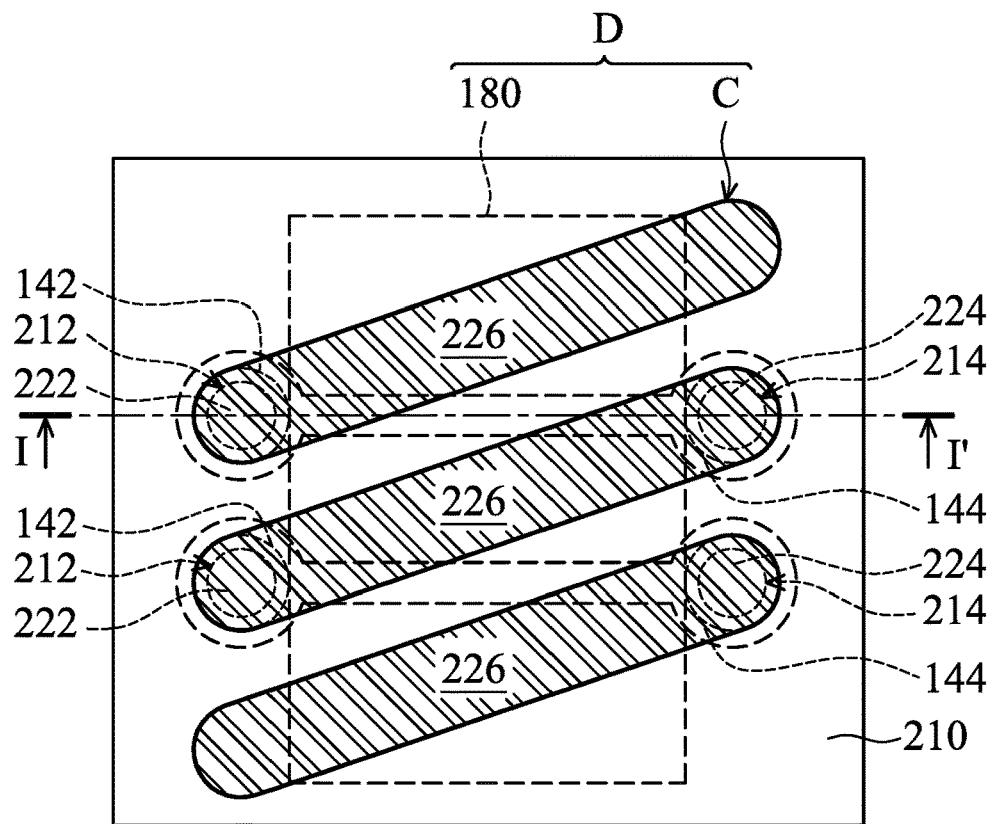
Figures 1, 1K:
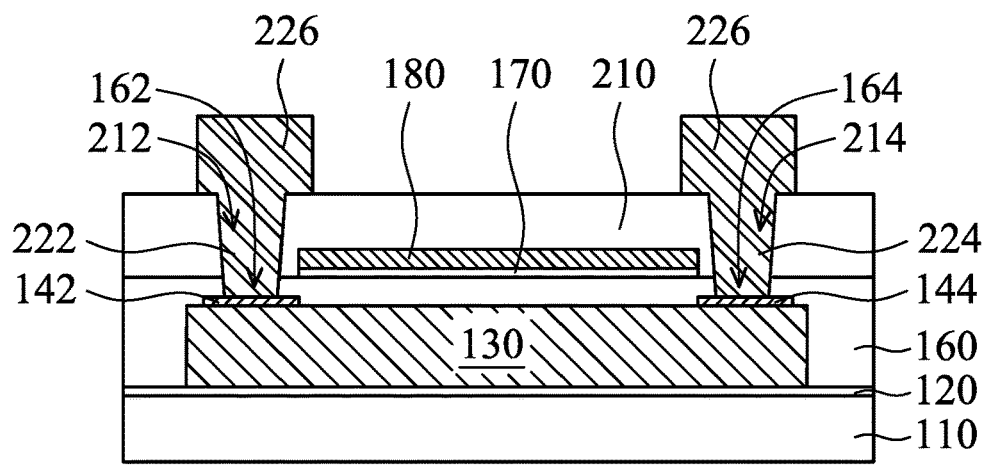
Figure 1L:
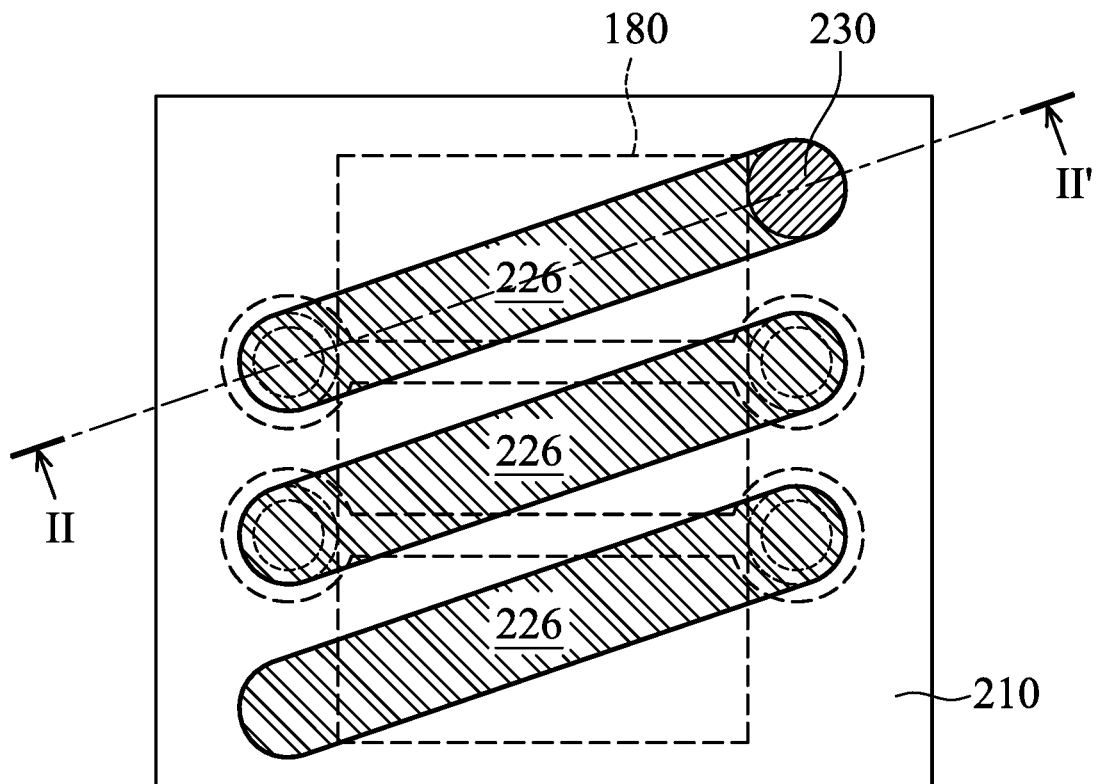
Figures 1, 1L:
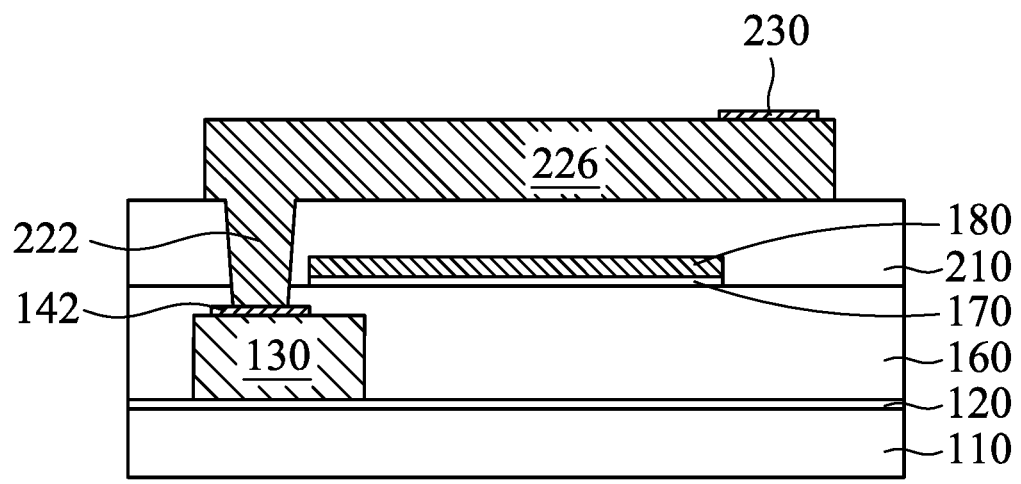
Figure 1M:
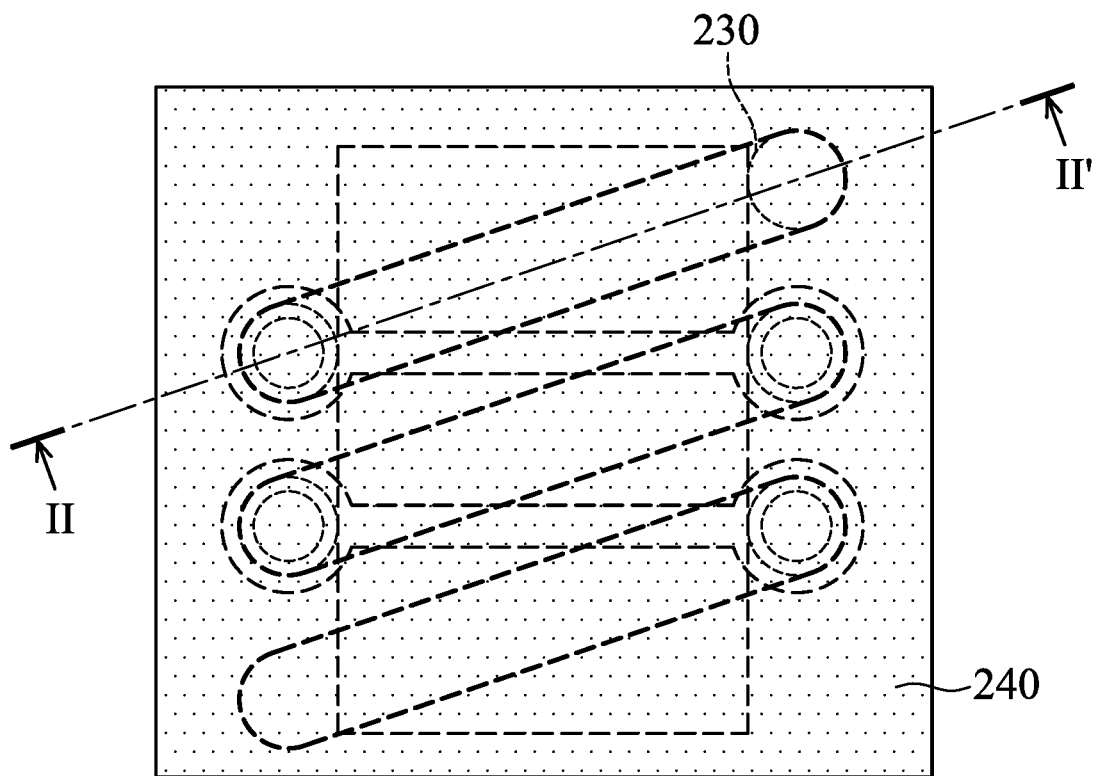
Figures 1, 1M:
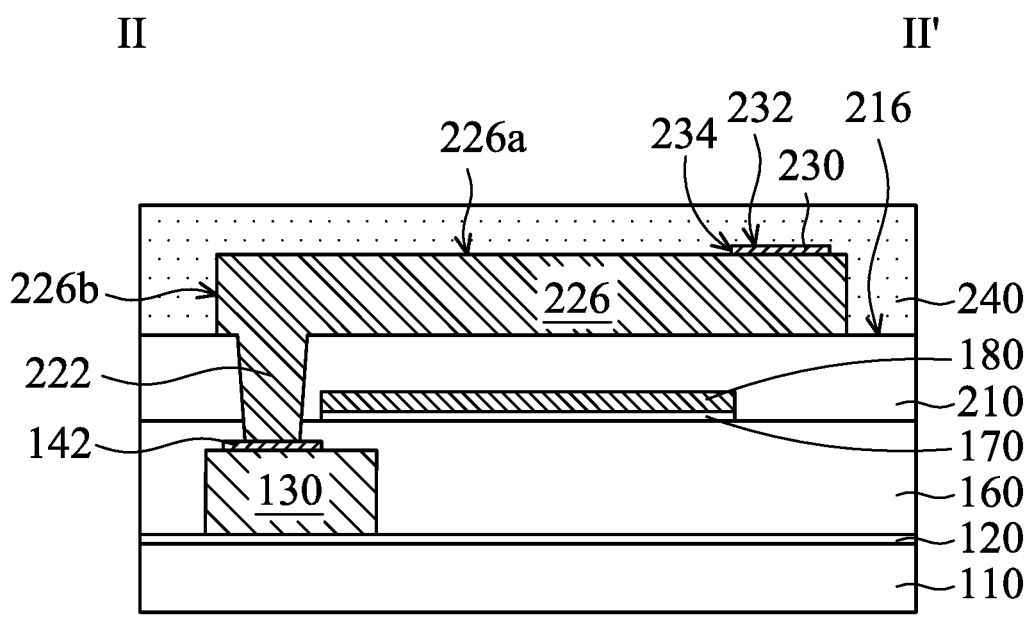
Figure 1N:
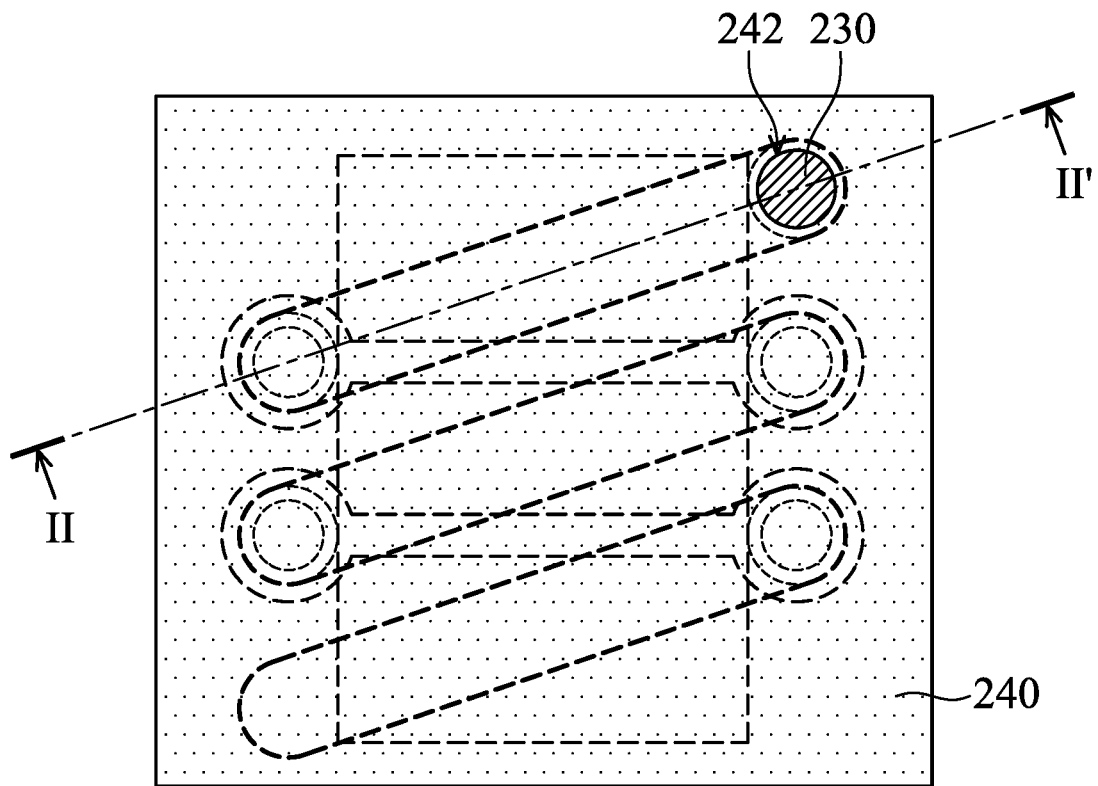
Figures 1, 1N:
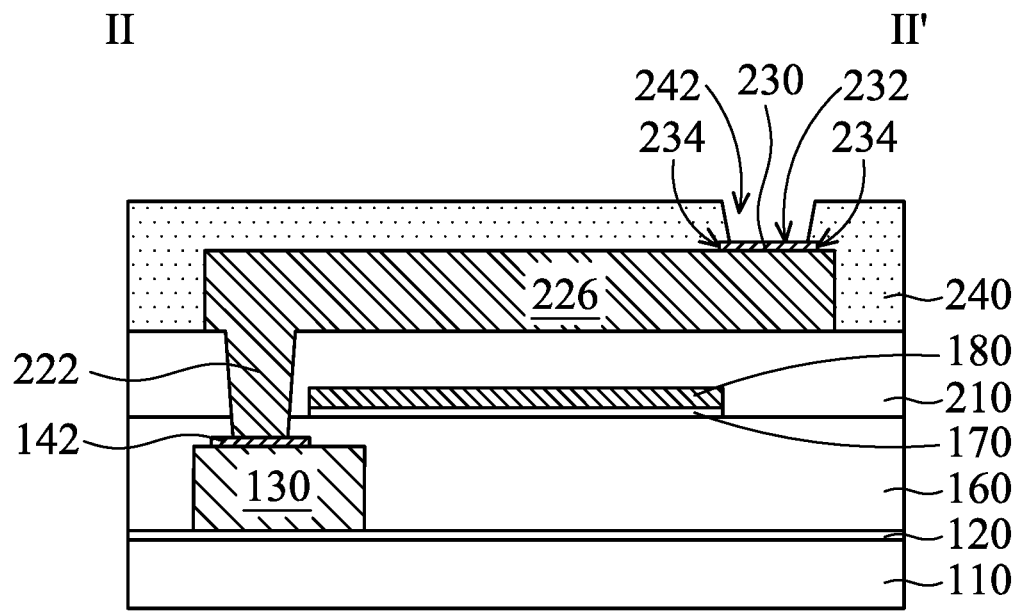
Figure 1O:
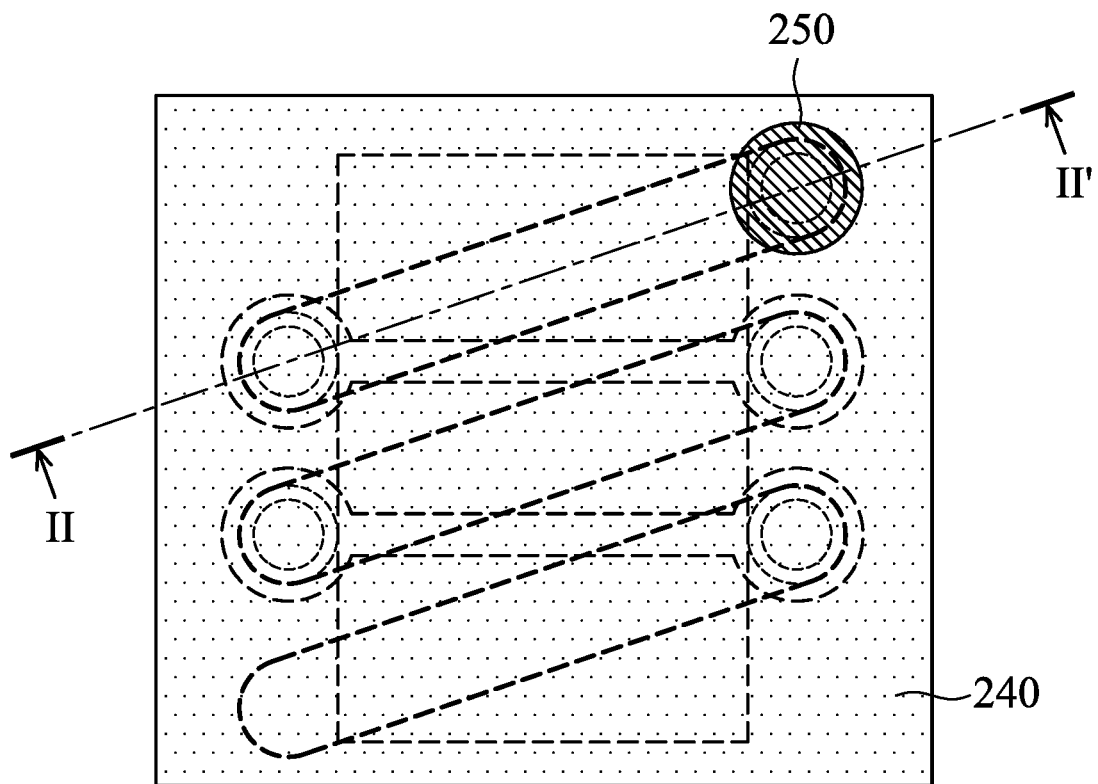
Figures 1, 1O:
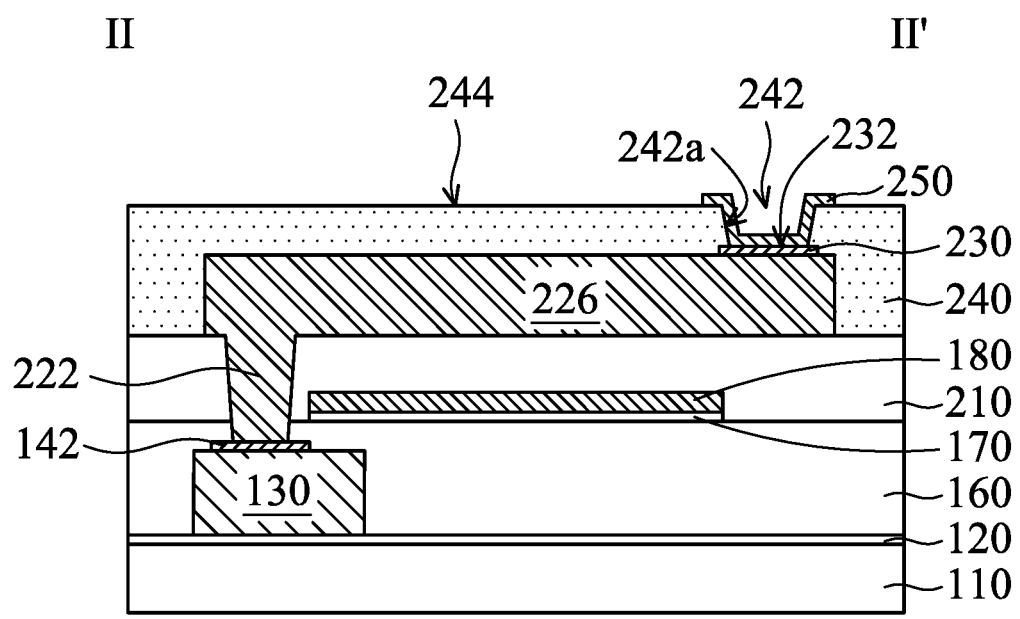
Figure 1P:
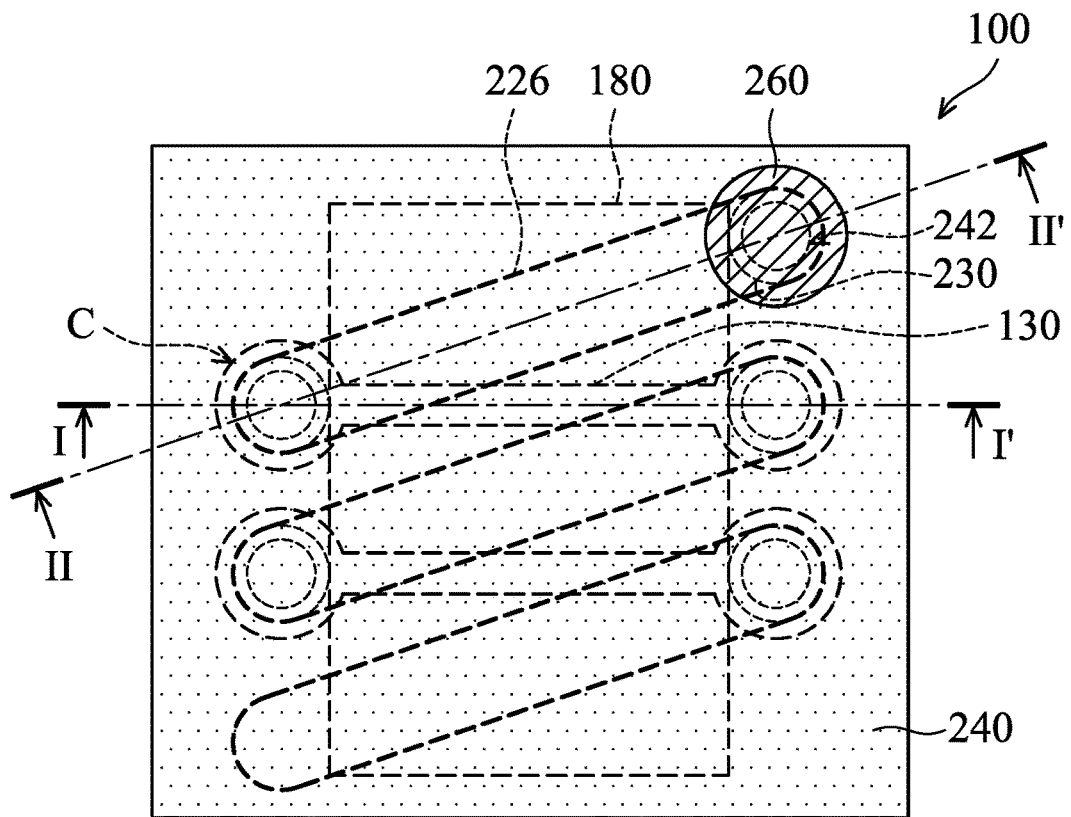
Figures 1, 1P:
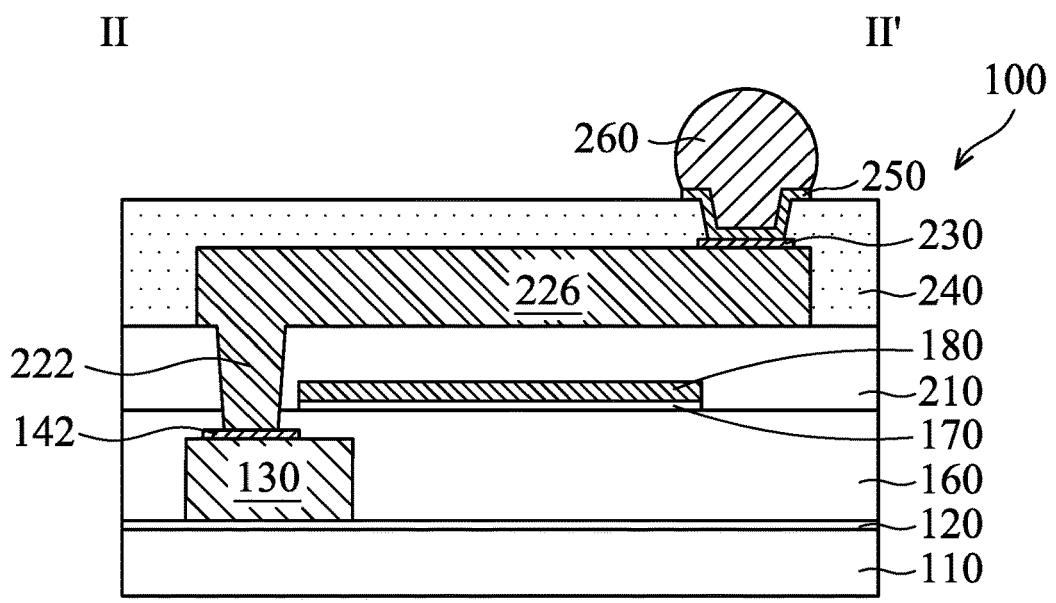

FIGS. 1A-1P are top views of various stages of a process for forming a semiconductor device structure, in accordance with some embodiments. FIG. 1A-1 to FIG. 1K-1 are cross-sectional views illustrating the semiconductor device structure along a sectional line I-I' in FIGS. 1A-1K, in accordance with some embodiments.

Figures 1, 1P, 2:
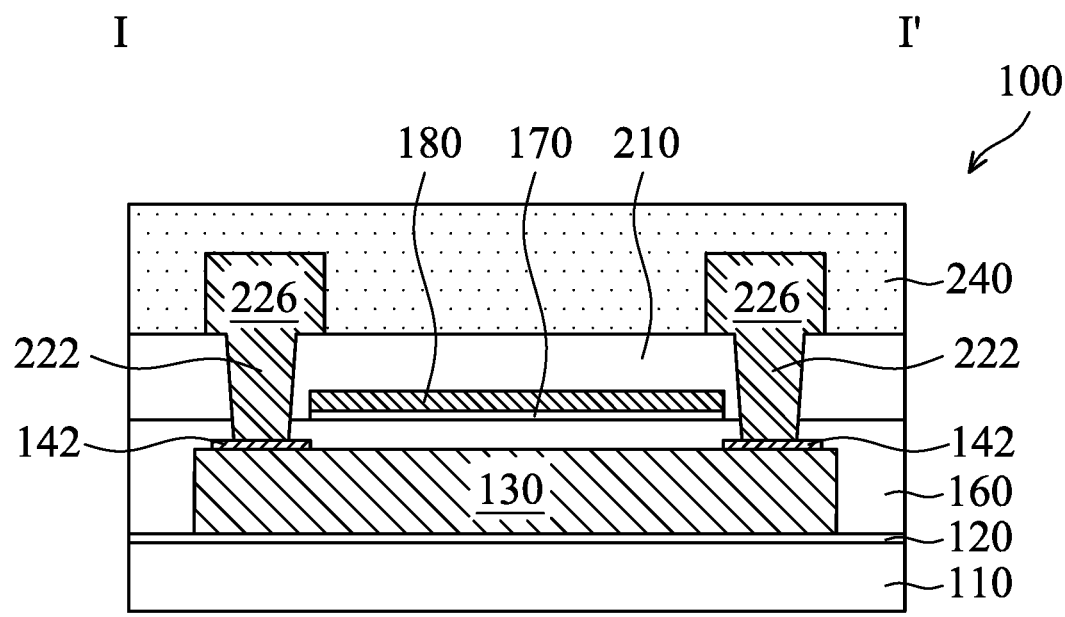
Figure 2:
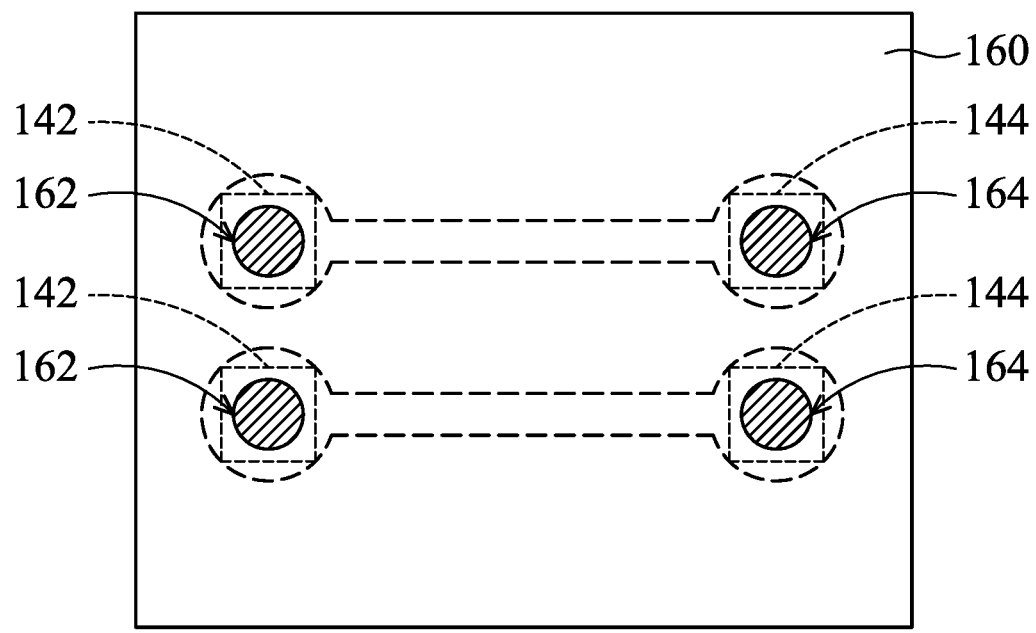

FIG. 1L-1 to FIG. 1P-1 are cross-sectional views illustrating the semiconductor device structure along a sectional line II-II' in FIGS. 1L-1P, in accordance with some embodiments. FIG. 1P-2 is a cross-sectional view illustrating the semiconductor device structure along a sectional line I-I' in FIG. 1P, in accordance with some embodiments.

As shown in FIGS. 1A and 1A-1, a substrate 110 is provided, in accordance with some embodiments. In some embodiments, the substrate 110 is a bulk semiconductor substrate, such as a semiconductor wafer. For example, the substrate 110 is a silicon wafer. In some other embodiments, the substrate 110 is a chip.

The substrate 110 may include silicon or another elementary semiconductor material such as germanium. In some other embodiments, the substrate 110 includes a compound semiconductor. The compound semiconductor may include silicon germanium, gallium arsenide, silicon carbide, indium arsenide, indium phosphide, another suitable compound semiconductor, or a combination thereof.

In some embodiments, the substrate 110 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the substrate 110. The device elements are not shown in figures for the purpose of simplicity and clarity. Examples of the various device elements include transistors, diodes, another suitable element, or a combination thereof.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes are performed to form the various device elements. The processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A and 1A-1, a passivation layer 120 is formed over the substrate 110, in accordance with some embodiments. The passivation layer 120 is made of an insulating material, in accordance with some embodiments. The passivation layer 120 is made of a polymer material, silicon nitride, or silicon oxide, in accordance with some embodiments. The passivation layer 120 is formed using a coating process, a chemical vapor deposition (CVD) process, a physical vapor deposition (PVD) process, or another suitable process.

As shown in FIGS. 1A and 1A-1, conductive lines 130 are formed over the passivation layer 120, in accordance with some embodiments. In some embodiments, the conductive lines 130 are made of copper. In some other embodiments, the conductive lines 130 are made of aluminum, cobalt, nickel, tungsten, or another suitable metal or alloy. The conductive lines 130 are formed using a plating process (or a deposition process) and an etching process, in accordance with some embodiments.

Each conductive line 130 has two end portions 132 and 134 and a main portion 136, in accordance with some embodiments. The main portion 136 is connected to the end portions 132 and 134, in accordance with some embodiments. In some embodiments, a linewidth W1 of each end portion 132 or 134 is greater than a linewidth W2 of the main portion 136. In some other embodiments, the linewidth W1 of each end portion 132 or 134 is substantially equal to the linewidth W2 of the main portion 136.

As shown in FIGS. 1B and 1B-1, a protection layer 140 is formed over the conductive lines 130 and the passivation layer 120, in accordance with some embodiments. The protection layer 140 conformally covers the conductive lines 130 and the passivation layer 120, in accordance with some embodiments. The protection layer 140 and the conductive lines 130 are made of different conductive materials, in accordance with some embodiments.

In some cases, the conductive material of the conductive lines 130 may tend to react with sulfur and oxygen in subsequent processes and form a $Cu_xO_yS_z$ layer over the conductive lines 130, wherein x, y, and z are all positive integers. The $Cu_xO_yS_z$ layer may increase the contact resistance between the conductive lines 130 and conductive via structures subsequently formed on the conductive lines 130.

In some embodiments, the protection layer 140 is made of a conductive material having less reactivity with sulfur and oxygen than the conductive material of the conductive lines 130. Therefore, the protection layer 140 may prevent the conductive material of the conductive lines 130 from reacting with sulfur and oxygen in subsequent processes and therefore prevent the $Cu_xO_yS_z$ layer from forming over the conductive lines 130. As a result, the protection layer 140 may reduce the contact resistance between the conductive lines 130 and conductive via structures subsequently formed on the conductive lines 130.

In some embodiments, the protection layer 140 is made of titanium (Ti). In some other embodiments, the protection layer 140 is made of gold (Au), silver (Ag), vanadium (V), chromium (Cr), tantalum (Ta), molybdenum (Mo), iron (Fe), palladium (Pd), indium (In), or gallium (Ga). The protection layer 140 is formed using a plating process (e.g., an electroplating process) or a deposition process (e.g., a physical vapor deposition process or a chemical vapor deposition process), in accordance with some embodiments.

As shown in FIGS. 1C and 1C-1, a mask layer 150 is formed over the protection layer 140, in accordance with some embodiments. The mask layer 150 covers the protection layer 140, which is directly over the end portions 132 and 134, in accordance with some embodiments. The mask layer 150 is made of a photoresist material, such as a polymer material, in accordance with some embodiments.

As shown in FIGS. 1C and 1D, the protection layer 140, which is not covered by the mask layer 150, is removed, in accordance with some embodiments. The remaining protection layer 140 forms protection caps 142 and 144, in accordance with some embodiments. The removal process includes an etching process such as a dry etching process or a wet etching process, in accordance with some embodiments. Thereafter, as shown in FIGS. 1D and 1D-1, the mask layer 150 is removed, in accordance with some embodiments.

The thickness T1 of the protection cap 142 or 144 is less than the thickness T2 of the conductive line 130 thereunder, in accordance with some embodiments. The thickness T1 ranges from about 5 nm to about 5 µm, in accordance with some embodiments. The thickness T2 ranges from about 4 µm to about 30 µm, in accordance with some embodiments. The protection caps 142 are directly over the end portions 132 respectively, in accordance with some embodiments. The protection caps 144 are directly over the end portions 134 respectively, in accordance with some embodiments.

The size of the protection cap 142 or 144 is less than the size of the end portions 132 or 134 thereunder, in accordance with some embodiments. For example, the maximum width W3 of the protection cap 142 or 144 is less than the maximum width W4 of the end portions 132 or 134 thereunder, in accordance with some embodiments.

The protection cap 142 does not cover the edge 132e of the end portion 132 thereunder, in accordance with some embodiments. The protection cap 142 is spaced apart from the entire edge 132e of the end portion 132 thereunder, in accordance with some embodiments. The protection cap 144 does not cover the edge 134e of the end portion 134 thereunder, in accordance with some embodiments. The protection cap 144 is spaced apart from the entire edge 134e of the end portion 134 thereunder, in accordance with some embodiments.

As shown in FIGS. 1E and 1E-1, a photosensitive dielectric layer 160 is formed over the passivation layer 120, the conductive lines 130, and the protection caps 142 and 144, in accordance with some embodiments. The photosensitive dielectric layer 160 is in direct contact with the conductive lines 130 and the protection caps 142 and 144, in accordance with some embodiments.

The photosensitive dielectric layer 160 is in direct contact with top surfaces 138 and sidewalls 139 of the conductive lines 130, top surfaces 142a and sidewalls (or edges) 142b of the protection caps 142, and top surfaces 144a and sidewalls (or edges) 144b of the protection caps 144, in accordance with some embodiments.

The photosensitive dielectric layer 160 is made of a photosensitive polymer material, in accordance with some embodiments. The photosensitive polymer material includes polybenzoxazole (PBO), in accordance with some embodiments. The photosensitive polymer material includes sulfur, in accordance with some embodiments. The photosensitive polymer material includes 2,3,4-Trihydroxybenzophenone tris(1,2-naphthoquinonediazide-5-sulfonate), which includes sulfur, in accordance with some embodiments. The structure of 2,3,4-Trihydroxybenzophenone tris(1,2-naphthoquinonediazide-5-sulfonate) is shown as follows.

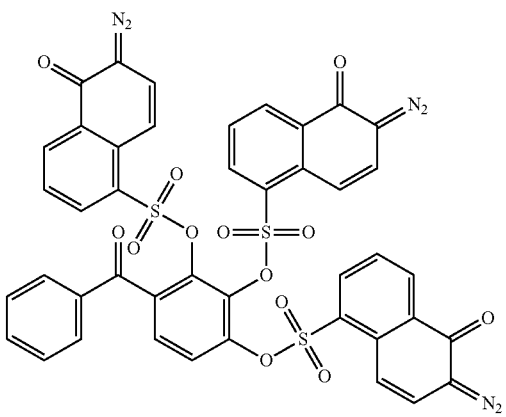

As shown in FIGS. 1F and 1F-1, portions of the photosensitive dielectric layer 160 directly over the protection caps 142 and 144 are removed, in accordance with some embodiments. The removal process includes a photolithography process, in accordance with some embodiments.

The removal process forms openings 162 and 164 in the photosensitive dielectric layer 160, in accordance with some embodiments. The openings 162 are over the protection caps 142 respectively, in accordance with some embodiments. Each opening 162 partially exposes the protection cap 142 thereunder, in accordance with some embodiments.

The openings 164 are over the protection caps 144 respectively, in accordance with some embodiments. Each opening 164 partially exposes the protection cap 144 thereunder, in accordance with some embodiments. The photosensitive dielectric layer 160 covers peripheral portions 142p and 144p of the top surfaces 142a and 144a, in accordance with some embodiments. The peripheral portions 142p and 144p of the top surfaces 142a and 144a have a ring shape, in accordance with some embodiments.

In some embodiments, a width W5 of the peripheral portion 142p of the top surface 142a ranges from about 1 µm to about 50 µm, in accordance with some embodiments. The width W5 is equal to a distance between the inner wall 162a of the opening 162 and the sidewall 142b of the protection cap 142, in accordance with some embodiments.

In some embodiments, a width W6 of the peripheral portion 144p of the top surface 144a ranges from about 1 µm to about 50 µm, in accordance with some embodiments. The width W6 is equal to a distance between the inner wall 164a of the opening 164 and the sidewall 144b of the protection cap 144, in accordance with some embodiments. The photosensitive dielectric layer 160 covers the entire sidewalls (or edges) 142b and 144b, in accordance with some embodiments.

The photosensitive dielectric layer 160 over the conductive lines 130 has a thickness T3, in accordance with some embodiments. The thickness T3 is greater than the thickness T1 of the protection cap 142 or 144, in accordance with some embodiments. The thickness T3 ranges from about 3 µm to about 50 µm, in accordance with some embodiments. The photosensitive dielectric layer 160 over the passivation layer 120 has a thickness T4, in accordance with some embodiments. The thickness T4 ranges from about 7 µm to about 80 µm, in accordance with some embodiments.

The angle θ1 between the top surfaces 142a and an inner wall 162a of the opening 162 ranges about 5° to about 90°, in accordance with some embodiments. The angle θ2 between the top surfaces 144a and an inner wall 164a of the opening 164 ranges about 5° to about 90°, in accordance with some embodiments.

After the removal process, a curing process is performed over the photosensitive dielectric layer 160, in accordance with some embodiments. The process temperature of the curing process ranges from about 300° C. to about 350° C., in accordance with some embodiments.

Since the conductive material of the protection caps 142 and 144 has less reactivity with sulfur (coming from the photosensitive dielectric layer 160) and oxygen (coming from the environment and/or the photosensitive dielectric layer 160) than the conductive material of the conductive lines 130, the protection caps 142 and 144 prevent the conductive lines 130 thereunder from reacting with sulfur and oxygen and therefore prevent the $Cu_xO_yS_z$ layer from forming over the conductive lines 130, in accordance with some embodiments. Therefore, the formation of the protection caps 142 and 144 improves the electrical properties of the conductive lines 130, in accordance with some embodiments.

Figure 3:
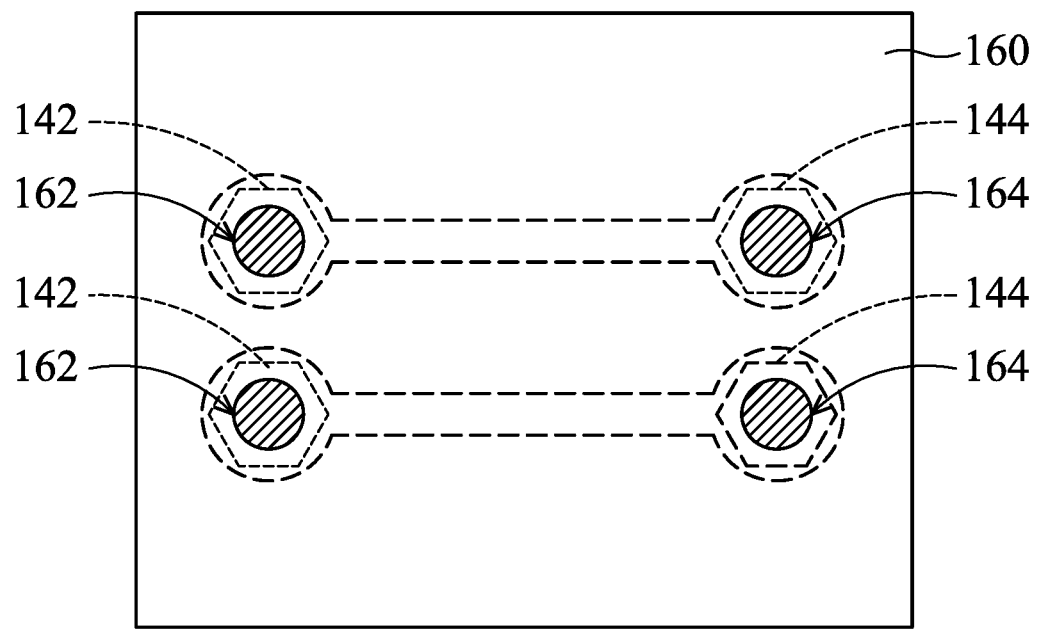
FIG. 3 is a top view of a semiconductor device structure, in accordance with some embodiments.

In some embodiments, the protection caps 142 and 144 have a round shape (as shown in FIG. 1F). In some other embodiments, the protection caps 142 and 144 have a polygonal shape. For example, as shown in FIG. 2, the protection caps 142 and 144 have a rectangle shape or a square shape. As shown in FIG. 3, the protection caps 142 and 144 have a hexagonal shape.

As shown in FIGS. 1G and 1G-1, an etching stop layer 170 is formed over the photosensitive dielectric layer 160 and the protection caps 142 and 144, in accordance with some embodiments. The etching stop layer 170 is made of a dielectric material, in accordance with some embodiments. The dielectric material includes silicon nitride, in accordance with some embodiments. The etching stop layer 170 is formed using a chemical vapor deposition process or a physical vapor deposition process, in accordance with some embodiments.

As shown in FIGS. 1G and 1G-1, a magnetic layer 180a is formed over the etching stop layer 170, in accordance with some embodiments. In some embodiments, the magnetic layer 180a is made of a ferromagnetic material. In some embodiments, the magnetic layer 180a is made of $Co_xZr_yTa_z$ (CZT), where x, y, and z represents the atomic percentage of cobalt (Co), zirconium (Zr), and tantalum (Ta), respectively. In some embodiments, x is in a range from about 0.85 to about 0.95, y is in a range from about 0.025 to about 0.075, and z is in a range from about 0.025 to about 0.075. In some embodiments, x=0.915, y=0.04, and z=0.045 for the CZT material.

In some embodiments, the magnetic layer 180a is made of $Ni_xZn_yCu_z$, where x, y, and z represents the atomic percentage of nickel (Ni), zinc (Zn), and copper (Cu), respectively. In some embodiments, x is in a range from about 0.4 to about 0.6, y is in a range from about 0.2 to about 0.4, and z is in a range from about 0.1 to about 0.2.

In some embodiments, the magnetic layer 180a is made of $Co_xZr_yNb_z$, where x, y, and z represents the atomic percentage of cobalt (Co), zirconium (Zr), and niobium (Nb), respectively. In some embodiments, x is in a range from about 0.7 to about 0.9, y is in a range from about 0.01 to about 0.05, and z is in a range from about 0.01 to about 0.07.

In some embodiments, the magnetic layer 180a is made of $Fe_x(TaN)_y$, where x and y represents the atomic percentage of iron (Fe) and tantalum nitride (TaN), respectively. In some embodiments, x is in a range from about 0.7 to about 0.9, and y is in a range from about 0.05 to about 0.2.

In some embodiments, the magnetic layer 180a is made of $Fe_xCo_yB_z$, where x, y, and z represents the atomic percentage of iron (Fe), cobalt (Co), and boron (B), respectively. In some embodiments, x is in a range from about 0.1 to about 0.3, y is in a range from about 0.1 to about 0.3, and z is in a range from about 0.4 to about 0.6.

In some embodiments, the magnetic layer 180a is made of $Ni_xZn_yFe_zO_w$, where x, y, z, and w represents the atomic percentage of nickel (Ni), zinc (Zn), iron (Fe), and oxygen (O), respectively. In some embodiments, x is in a range from about 0.3 to about 0.4, y is in a range from about 0.1 to about 0.2, z is in a range from about 0.2 to about 0.5, and w is in a range from about 0.15 to about 0.25. In some embodiments, the magnetic layer 180a includes a multilayer structure, which is made of a combination of the ferromagnetic materials mentioned above such as CoZrTa—FeCoB.

In some embodiments, the magnetic layer 180a is formed using a physical vapor deposition (PVD) process, a chemical vapor deposition (CVD) process, a combination thereof, or another suitable deposition process.

In some embodiments, the magnetic layer 180a includes films stacked together. In some embodiments, the magnetic layer 180a is formed by repeating a deposition process (e.g., a physical vapor deposition process or a chemical vapor deposition process) multiple times.

As shown in FIGS. 1G and 1G-1, a mask layer 190 is formed over the magnetic layer 180a, in accordance with some embodiments. The mask layer 190 covers the magnetic layer 180a, which is between the protection cap 142 or 144 (or the openings 162 and 164), in accordance with some embodiments. The mask layer 190 is made of a photoresist material, such as a polymer material, in accordance with some embodiments.

As shown in FIGS. 1G-1 and 1H-1, the magnetic layer 180a and the etching stop layer 170, which are not directly under the mask layer 190, are removed, in accordance with some embodiments. The removal process includes an etching process such as a wet etching process or a dry etching process, in accordance with some embodiments. After the removal process, the remaining magnetic layer 180a forms a magnetic core 180, in accordance with some embodiments.

As shown in FIGS. 1H and 1H-1, the magnetic core 180 is formed over the photosensitive dielectric layer 160, in accordance with some embodiments. The magnetic core 180 is formed between protection cap 142 or 144 (or the openings 162 and 164), in accordance with some embodiments. The magnetic core 180 extends across the conductive lines 130, in accordance with some embodiments.

As shown in FIGS. 1I and 1I-1, a photosensitive dielectric layer 210 is formed over the photosensitive dielectric layer 160, the protection caps 142 and 144, the magnetic core 180, and the etching stop layer 170, in accordance with some embodiments. The photosensitive dielectric layer 210 is in direct contact with the photosensitive dielectric layer 160, the protection caps 142 and 144, the magnetic core 180, and the etching stop layer 170, in accordance with some embodiments. The photosensitive dielectric layer 210 covers the entire magnetic core 180, in accordance with some embodiments.

The photosensitive dielectric layer 210 is made of a photosensitive polymer material, in accordance with some embodiments. The photosensitive polymer material includes sulfur, in accordance with some embodiments. The photosensitive polymer material includes polybenzoxazole (PBO), in accordance with some embodiments. The photosensitive polymer material includes 2,3,4-Trihydroxybenzophenone tris(1,2-naphthoquinonediazide-5-sulfonate), which includes sulfur, in accordance with some embodiments.

As shown in FIGS. 1J and 1J-1, portions of the photosensitive dielectric layer 210 directly over the protection caps 142 and 144 are removed, in accordance with some embodiments. The removal process includes a photolithography process, in accordance with some embodiments. The removal process forms openings 212 and 214 in the photosensitive dielectric layer 210, in accordance with some embodiments. The openings 212 are over the protection caps 142 respectively, in accordance with some embodiments.

Each opening 212 partially exposes the protection cap 142 thereunder, in accordance with some embodiments. Each opening 212 is connected to the opening 162 thereunder, in accordance with some embodiments. The opening 212 has an inner wall 212a, in accordance with some embodiments.

The inner wall 212a is aligned with (or coplanar with) the inner wall 162a of the opening 162 thereunder, in accordance with some embodiments. The photosensitive dielectric layer 210 covers ring-shaped peripheral portions 142p of the top surfaces 142a of the protection caps 142, in accordance with some embodiments.

The openings 214 are over the protection caps 144 respectively, in accordance with some embodiments. Each opening 214 partially exposes the protection cap 144 thereunder, in accordance with some embodiments. Each opening 214 is connected to the opening 164 thereunder, in accordance with some embodiments. The opening 214 has an inner wall 214a, in accordance with some embodiments. The inner wall 214a is aligned with (or coplanar with) the inner wall 164a of the opening 164 thereunder, in accordance with some embodiments.

The photosensitive dielectric layer 210 covers ring-shaped peripheral portions 144p of the top surfaces 144a of the protection caps 144, in accordance with some embodiments. After the removal process, a curing process is performed over the photosensitive dielectric layer 210, in accordance with some embodiments. The process temperature of the curing process ranges from about 300° C. to about 350° C., in accordance with some embodiments.

Since the conductive material of the protection caps 142 and 144 has less reactivity with sulfur (coming from the photosensitive dielectric layer 210) and oxygen (coming from the environment and/or the photosensitive dielectric layer 210) than the conductive material of the conductive lines 130, the protection caps 142 and 144 prevent the conductive lines 130 thereunder from reacting with sulfur and oxygen, in accordance with some embodiments. Therefore, the formation of the protection caps 142 and 144 improves the electrical properties of the conductive lines 130, in accordance with some embodiments.

As shown in FIGS. 1K and 1K-1, conductive via structures 222 are formed in the openings 162 and 212, in accordance with some embodiments. The conductive via structures 222 fills the openings 162 and 212, in accordance with some embodiments. The conductive via structures 222 pass through the photosensitive dielectric layers 160 and 210, in accordance with some embodiments.

The conductive via structures 222 are over the protection caps 142 respectively, in accordance with some embodiments. The conductive via structures 222 are electrically connected to the conductive lines 130 through the protection caps 142, in accordance with some embodiments. The protection caps 142 physically separate the conductive lines 130 from the conductive via structures 222, in accordance with some embodiments.

As shown in FIGS. 1K and 1K-1, conductive via structures 224 are formed in the openings 164 and 214, in accordance with some embodiments. The conductive via structures 224 fills the openings 164 and 214, in accordance with some embodiments. The conductive via structures 224 pass through the photosensitive dielectric layers 160 and 210, in accordance with some embodiments.

The conductive via structures 224 are over the protection caps 144 respectively, in accordance with some embodiments. The conductive via structures 224 are electrically connected to the conductive lines 130 through the protection caps 144, in accordance with some embodiments. The protection caps 144 physically separate the conductive lines 130 from the conductive via structures 224, in accordance with some embodiments.

Since the protection caps 142 and 144 prevent the conductive lines 130 from reacting with sulfur and oxygen, the protection caps 142 and 144 reduce the resistance between the conductive via structures 222 and the conductive lines 130 and the resistance between the conductive via structures 224 and the conductive lines 130, in accordance with some embodiments.

As shown in FIGS. 1K and 1K-1, conductive lines 226 are formed over the conductive via structures 222 and 224, in accordance with some embodiments. The conductive lines 226 are electrically connected to the conductive via structures 222 and 224, the protection caps 142 and 144, and the conductive lines 130, in accordance with some embodiments.

The conductive lines 226 are over the magnetic core 180, in accordance with some embodiments. The conductive lines 226 extend across the magnetic core 180, in accordance with some embodiments. The conductive lines 130 and 226, the conductive via structures 222 and 224, and the protection caps 142 and 144 together form a coil structure C, in accordance with some embodiments.

The coil structure C surrounds the magnetic core 180, in accordance with some embodiments. The coil structure C and the magnetic core 180 together form an inductor D, in accordance with some embodiments. Since the protection caps 142 and 144 reduce the resistance between the conductive via structures 222 and 224 and the conductive lines 130, the resistance of the coil structure C is reduced as well, in accordance with some embodiments. Therefore, the protection caps 142 and 144 improve the efficiency of the inductor D, in accordance with some embodiments. The photosensitive dielectric layers 160 and 210 separate the magnetic core 180 from the conductive lines 130 and 226, the protection caps 142 and 144, and the conductive via structures 222 and 224, in accordance with some embodiments.

The conductive material of the protection caps 142 and 144 is different from the conductive material of the conductive via structures 222 and 224, in accordance with some embodiments. The conductive via structures 222 and 224 and the conductive lines 130 and 226 are made of the same conductive material, in accordance with some embodiments.

The conductive via structures 222 and 224 and the conductive lines 226 are made of copper, in accordance with some embodiments. In some other embodiments, the conductive via structures 222 and 224 and the conductive lines 226 are made of aluminum, cobalt, nickel, tungsten, or another suitable metal or alloy.

The formation of the conductive via structures 222 and 224 and the conductive lines 226 includes: forming a seed layer in the openings 162, 164, 212, and 214 and over the photosensitive dielectric layer 210; forming a photoresist layer over the seed layer, where the photoresist layer has trenches exposing portions of the seed layer; electroplating a conductive layer in the trenches; removing the photoresist layer; and removing the seed layer originally under the photoresist layer, in accordance with some embodiments.

As shown in FIGS. 1L and 1L-1, a protection cap 230 is formed over the conductive line 226, in accordance with some embodiments. The protection cap 230 and the conductive lines 226 are made of different conductive materials, in accordance with some embodiments. In some embodiments, the protection cap 230 is made of a conductive material having less reactivity with sulfur and oxygen than the conductive material of the conductive lines 226.

In some embodiments, the protection cap 230 is made of titanium (Ti). In some other embodiments, the protection cap 230 is made of gold (Au), silver (Ag), vanadium (V), chromium (Cr), tantalum (Ta), molybdenum (Mo), iron (Fe), palladium (Pd), indium (In), or gallium (Ga). The protection cap 230 is formed using a plating process (e.g., an electroplating process) or a deposition process (e.g., a physical vapor deposition process or a chemical vapor deposition process), in accordance with some embodiments.

As shown in FIGS. 1M and 1M-1, a photosensitive dielectric layer 240 is formed over the photosensitive dielectric layer 210, the conductive lines 226, and the protection cap 230, in accordance with some embodiments. The photosensitive dielectric layer 240 is in direct contact with the photosensitive dielectric layer 210, the conductive lines 226, and the protection cap 230, in accordance with some embodiments.

The photosensitive dielectric layer 240 is in direct contact with top surfaces 226a and sidewalls 226b of the conductive lines 226, a top surfaces 232 and sidewalls (or edges) 234 of the protection cap 230, and a top surface 216 of the photosensitive dielectric layer 210, in accordance with some embodiments.

The photosensitive dielectric layer 240 is made of a photosensitive polymer material, in accordance with some embodiments. The photosensitive polymer material includes sulfur, in accordance with some embodiments. The photosensitive polymer material includes 2,3,4-Trihydroxybenzophenone tris(1,2-naphthoquinonediazide-5-sulfonate), which includes sulfur, in accordance with some embodiments. The photosensitive polymer material includes polybenzoxazole (PBO), in accordance with some embodiments.

As shown in FIGS. 1N and 1N-1, a portion of the photosensitive dielectric layer 240 directly over the protection cap 230 is removed, in accordance with some embodiments. The removal process includes a photolithography process, in accordance with some embodiments. The removal process forms an opening 242 in the photosensitive dielectric layer 240, in accordance with some embodiments. The opening 242 is over the protection cap 230, in accordance with some embodiments. The opening 242 partially exposes the protection cap 230 thereunder, in accordance with some embodiments.

The photosensitive dielectric layer 240 covers a ring-shaped peripheral portion 232p of a top surface 232 of the protection cap 230, in accordance with some embodiments. The photosensitive dielectric layer 240 covers entire sidewalls (or edges) 234 of the protection cap 230, in accordance with some embodiments. After the removal process, a curing process is performed over the photosensitive dielectric layer 240, in accordance with some embodiments. The process temperature of the curing process ranges from about 300° C. to about 350° C., in accordance with some embodiments.

Since the conductive material of the protection cap 230 has less reactivity with sulfur (coming from the photosensitive dielectric layer 240) and oxygen (coming from the environment and/or the photosensitive dielectric layer 240) than the conductive material of the conductive lines 226, the protection cap 230 prevents the conductive lines 226 thereunder from reacting with sulfur and oxygen, in accordance with some embodiments. Therefore, the formation of the protection cap 230 improves the electrical properties of the conductive lines 226, in accordance with some embodiments.

As shown in FIGS. 1O and 1O-1, an under-bump metallization (UBM) structure 250 is formed over the protection cap 230, in accordance with some embodiments. The under-bump metallization structure 250 conformally covers the top surface 232 of the protection cap 230, inner walls 242a of the opening 242, and a top surface 244 of the photosensitive dielectric layer 240, in accordance with some embodiments.

The under-bump metallization structure 250 includes a first metallization layer (not shown), a second metallization layer (not shown), and a third metallization layer (not shown) sequentially stacked over the protection cap 230, in accordance with some embodiments. The first metallization layer includes copper or copper alloy, in accordance with some embodiments. The first metallization layer is formed using an electroplating process, in accordance with some embodiments.

The second metallization layer includes tin or tin alloy, in accordance with some embodiments. The second metallization layer is formed using an electroplating process or an immersion process, in accordance with some embodiments. The third metallization layer includes nickel or nickel alloy, for example nickel-palladium-gold (NiPdAu), nickel-gold (NiAu), nickel-palladium (NiPd) or another similar alloy, in accordance with some embodiments. The third metallization layer is formed using an electroless process or an immersion process, in accordance with some embodiments.

As shown in FIGS. 1P, 1P-1, and 1P-2, a conductive bump 260 is formed over the under-bump metallization structure 250, in accordance with some embodiments. The conductive bump 260 is made of Sn, SnAg, SnPb, SnAgCu, SnAgZn, SnZn, SnBiIn, SnIn, SnAu, SnPb, SnCu, SnZnIn, SnAgSb, or another suitable conductive material. In some embodiments, the conductive bump 260 is made of a lead-free solder material. In this step, a semiconductor device structure 100 is substantially formed, in accordance with some embodiments.

Figure 4:
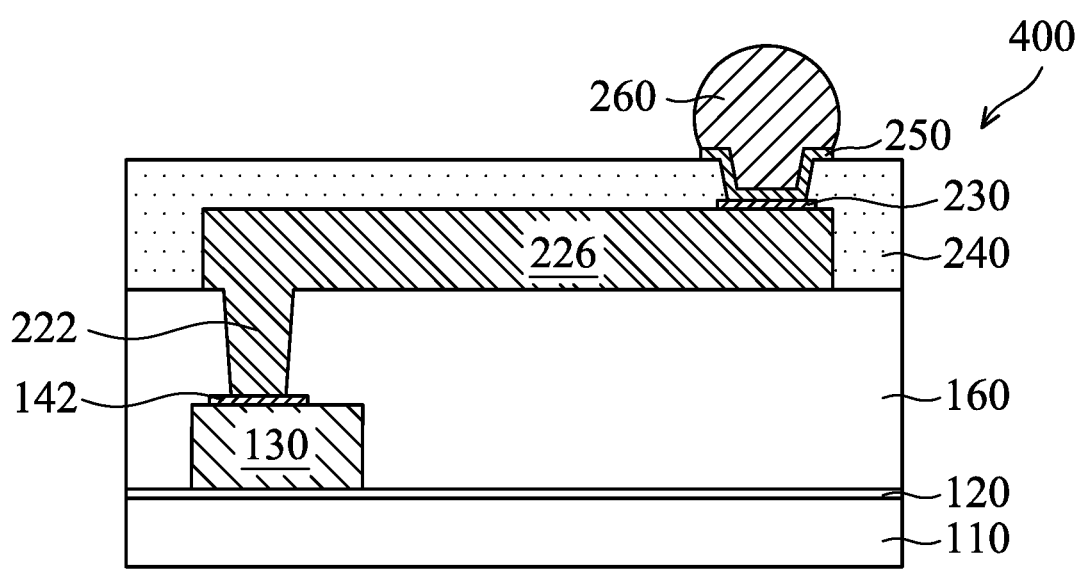
FIG. 4 is a cross-sectional view of a semiconductor device structure, in accordance with some embodiments.

FIG. 4 is a cross-sectional view of a semiconductor device structure 400, in accordance with some embodiments. As shown in FIG. 4, the semiconductor device structure 400 is similar to the semiconductor device structure 100 of FIG. 1P-1, except that the semiconductor device structure 400 does not have the etching stop layer 170, the magnetic core 180, and the photosensitive dielectric layer 210 of the semiconductor device structure 100 of FIG. 1P-1, in accordance with some embodiments. The photosensitive dielectric layer 240 and the conductive line 226 are in direct contact with the photosensitive dielectric layer 160, in accordance with some embodiments.

In accordance with some embodiments, semiconductor device structures and methods for forming the same are provided. The methods (for forming the semiconductor device structures) form a protection cap over a conductive line to prevent the conductive line under the protection cap from reacting with sulfur (coming from a subsequent formed photosensitive dielectric layer) and oxygen (coming from the environment and/or the subsequent formed photosensitive dielectric layer). Therefore, the formation of the protection cap improves the electrical properties of the conductive line.

In accordance with some embodiments, a semiconductor device structure is provided. The semiconductor device structure includes a first conductive line over a substrate. The semiconductor device structure includes a first protection cap over the first conductive line. The first protection cap and the first conductive line are made of different conductive materials. The semiconductor device structure includes a first photosensitive dielectric layer over the substrate, the first conductive line, and the first protection cap. The semiconductor device structure includes a conductive via structure passing through the first photosensitive dielectric layer and connected to the first protection cap. The semiconductor device structure includes a second conductive line over the conductive via structure and the first photosensitive dielectric layer. The semiconductor device structure includes a second protection cap over the second conductive line. The second protection cap and the second conductive line are made of different conductive materials. The semiconductor device structure includes a second photosensitive dielectric layer over the first photosensitive dielectric layer, the second conductive line, and the second protection cap. The second photosensitive dielectric layer exposes a portion of the second protection cap.

In accordance with some embodiments, a semiconductor device structure is provided. The semiconductor device structure includes a first conductive line over a substrate. The semiconductor device structure includes a first protection cap over the first conductive line. The first protection cap and the first conductive line are made of different conductive materials. The semiconductor device structure includes a first photosensitive dielectric layer over the substrate, the first conductive line, and the first protection cap. The semiconductor device structure includes a conductive via structure passing through the first photosensitive dielectric layer and connected to the first protection cap. The semiconductor device structure includes a second conductive line over the conductive via structure and the first photosensitive dielectric layer. The semiconductor device structure includes a second protection cap over the second conductive line. The second protection cap and the second conductive line are made of different conductive materials, and the first protection cap and the second protection cap are made of a same material.

In accordance with some embodiments, a semiconductor device structure is provided. The semiconductor device structure includes a first conductive line over a substrate. The semiconductor device structure includes a first protection cap over a first end portion of the first conductive line. The semiconductor device structure includes a first photosensitive dielectric layer over the substrate, the first conductive line, and the first protection cap. The semiconductor device structure includes a conductive via structure passing through the first photosensitive dielectric layer and connected to the first protection cap. The first protection cap, the first conductive line and the conductive via structure are made of different conductive materials. The semiconductor device structure includes a second conductive line over the conductive via structure and the first photosensitive dielectric layer. The semiconductor device structure includes a second protection cap over a second end portion of the second conductive line. The second protection cap and the second conductive line are made of different conductive materials. The semiconductor device structure includes a second photosensitive dielectric layer over the first photosensitive dielectric layer, the second conductive line, and the second protection cap. The second photosensitive dielectric layer is in direct contact with the second conductive line and the second protection cap, and the second photosensitive dielectric layer comprises sulfur.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a first conductive line over a substrate, wherein the first conductive line has a first portion and a second portion, the second portion is connected to the first portion, and a line width of the second portion increases in a direction away from the first portion;
   a first protection cap over the first conductive line, wherein the first protection cap and the first conductive line are made of different conductive materials, and the entire first protection cap is over the second portion;
   a first photosensitive dielectric layer over the substrate, the first conductive line, and the first protection cap;
   a conductive via structure passing through the first photosensitive dielectric layer and connected to the first protection cap;
   a second conductive line over the conductive via structure and the first photosensitive dielectric layer;
   a second protection cap over the second conductive line, wherein the second protection cap and the second conductive line are made of different conductive materials; and
   a second photosensitive dielectric layer over the first photosensitive dielectric layer, the second conductive line, and the second protection cap, wherein the second photosensitive dielectric layer exposes a portion of the second protection cap.

2. The semiconductor device structure as claimed in claim 1, wherein the first conductive line comprises copper, aluminum, cobalt, nickel, or tungsten, and the first protection cap comprises titanium, gold, silver, vanadium, chromium, tantalum, molybdenum, iron, palladium, indium, or gallium.

3. The semiconductor device structure as claimed in claim 1, wherein the first photosensitive dielectric layer and the second photosensitive dielectric layer comprise sulfur.

4. The semiconductor device structure as claimed in claim 1, wherein the second photosensitive dielectric layer covers a peripheral portion of a top surface of the second protection cap.

5. The semiconductor device structure as claimed in claim 1, wherein the second conductive line is electrically connected to the first conductive line through the conductive via structure and the first protection cap.

6. The semiconductor device structure as claimed in claim 1, further comprising:
   a magnetic core over the first photosensitive dielectric layer, wherein the magnetic core extends across the first conductive line; and
   a third photosensitive dielectric layer over the first photosensitive dielectric layer and the magnetic core, wherein the conductive via structure further passes through the third photosensitive dielectric layer, and the second conductive line and the second photosensitive dielectric layer are over the third photosensitive dielectric layer.

7. The semiconductor device structure as claimed in claim 6, wherein the second conductive line extends across the magnetic core.

8. The semiconductor device structure as claimed in claim 1, further comprising:
   a metallization structure over the portion of the second protection cap.

9. The semiconductor device structure as claimed in claim 8, further comprising:
   a conductive bump over the metallization structure.

10. The semiconductor device structure as claimed in claim 9, wherein the metallization structure and the conductive bump are partially over a top surface of the second photosensitive dielectric layer.

11. A semiconductor device structure, comprising:
    a first conductive line over a substrate, wherein the first conductive line has a first portion and a second portion, the second portion is connected to the first portion, and a first line width of the second portion is greater than a second line width of the first portion in a top view of the first conductive line;
    a first protection cap over the second portion of the first conductive line, wherein the first protection cap and the first conductive line are made of different conductive materials;
    a first photosensitive dielectric layer over the substrate, the first conductive line, and the first protection cap;
    a conductive via structure passing through the first photosensitive dielectric layer and connected to the first protection cap;
    a second conductive line over the conductive via structure and the first photosensitive dielectric layer; and
    a second protection cap over the second conductive line, wherein the second protection cap and the second conductive line are made of different conductive materials, and the first protection cap and the second protection cap are made of a same material.

12. The semiconductor device structure as claimed in claim 11, further comprising:
    a second photosensitive dielectric layer over the first photosensitive dielectric layer, the second conductive line, and the second protection cap, wherein the second photosensitive dielectric layer exposes a portion of the second protection cap.

13. The semiconductor device structure as claimed in claim 12, further comprising:

a conductive bump over the portion of the second protection cap, wherein the conductive bump is partially embedded in the second photosensitive dielectric layer.

14. The semiconductor device structure as claimed in claim 13, further comprising:
a metallization structure between the conductive bump and the portion of the second protection cap and between the conductive bump and the second photosensitive dielectric layer.

15. The semiconductor device structure as claimed in claim 11, wherein the second photosensitive dielectric layer comprises sulfur.

16. A semiconductor device structure, comprising:
a first conductive line over a substrate;
a first protection cap over a first end portion of the first conductive line, wherein the first protection cap has a first curved sidewall, the first end portion has a second curved sidewall, and the first curved sidewall of the first protection cap is misaligned with the second curved sidewall;
a first photosensitive dielectric layer over the substrate, the first conductive line, and the first protection cap;
a conductive via structure passing through the first photosensitive dielectric layer and connected to the first protection cap, wherein the first protection cap, the first conductive line and the conductive via structure are made of different conductive materials;
a second conductive line over the conductive via structure and the first photosensitive dielectric layer;
a second protection cap over a second end portion of the second conductive line, wherein the second protection cap and the second conductive line are made of different conductive materials; and
a second photosensitive dielectric layer over the first photosensitive dielectric layer, the second conductive line, and the second protection cap, wherein the second photosensitive dielectric layer is in direct contact with the second conductive line and the second protection cap, and the second photosensitive dielectric layer comprises sulfur.

17. The semiconductor device structure as claimed in claim 16, wherein the second photosensitive dielectric layer exposes a center portion of the second protection cap and covers a peripheral portion of the second protection cap.

18. The semiconductor device structure as claimed in claim 17, further comprising:
a metallization structure conformally covering the center portion of the second protection cap and the second photosensitive dielectric layer.

19. The semiconductor device structure as claimed in claim 18, further comprising:
a conductive bump over the metallization structure.

20. The semiconductor device structure as claimed in claim 16, wherein the conductive via structure is in direct contact with the first protection cap.

* * * * *